US008628620B2

(12) United States Patent
Kawato et al.

(10) Patent No.: US 8,628,620 B2
(45) Date of Patent: Jan. 14, 2014

(54) VAPOR DEPOSITION DEVICE AND VAPOR DEPOSITION METHOD

(75) Inventors: Shinichi Kawato, Osaka (JP); Nobuhiro Hayashi, Osaka (JP); Tohru Sonoda, Osaka (JP); Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/977,645

(22) PCT Filed: Dec. 28, 2011

(86) PCT No.: PCT/JP2011/080354
§ 371 (c)(1),
(2), (4) Date: Jun. 28, 2013

(87) PCT Pub. No.: WO2012/093627
PCT Pub. Date: Jul. 12, 2012

(65) Prior Publication Data
US 2013/0273746 A1    Oct. 17, 2013

(30) Foreign Application Priority Data

Jan. 7, 2011   (JP) .................................. 2011-002042

(51) Int. Cl.
*C23C 16/04*    (2006.01)
*C23C 16/00*    (2006.01)
*C23C 14/24*    (2006.01)
*C23C 14/22*    (2006.01)
*C23C 14/00*    (2006.01)

(52) U.S. Cl.
USPC .............. 118/720; 118/715; 118/50; 118/504

(58) Field of Classification Search
None
See application file for complete search history.

(56) References Cited

U.S. PATENT DOCUMENTS

| 3,669,060 | A | * | 6/1972 | Page et al. ...................... 118/663 |
| 2005/0118504 | A1 | * | 6/2005 | Honda et al. ................ 429/218.1 |
| 2010/0075036 | A1 | * | 3/2010 | Okazaki et al. ............. 427/255.5 |
| 2010/0143583 | A1 | * | 6/2010 | Honda et al. ................ 427/126.1 |
| 2011/0111121 | A1 | * | 5/2011 | Honda et al. ................... 427/180 |
| 2011/0177645 | A1 | * | 7/2011 | Vasquez et al. ................. 438/62 |

FOREIGN PATENT DOCUMENTS

| JP | 2002-235166 A | 8/2002 |
| JP | 2003-133067 A | 5/2003 |
| JP | 2003-173870 A | 6/2003 |
| JP | 2004-14146 A | 1/2004 |
| JP | 2004-349101 A | 12/2004 |

OTHER PUBLICATIONS

International Search Report received for PCT Patent Application No. PCT/JP2011/080354 mailed on Apr. 17, 2012, 3 pages (1 page of English Translation and 2 pages of ISR).

* cited by examiner

*Primary Examiner* — Dah-Wei Yuan
*Assistant Examiner* — Jethro Pence
(74) *Attorney, Agent, or Firm* — Morrison & Foerster LLP

(57) ABSTRACT

A vapor deposition device (50) includes a mask (60) having periodic patterns, and only a region of the mask (60) where a one-period pattern is formed is exposed. A length of the mask base material along a direction perpendicular to a long-side direction of the mask base material is shorter than a length of a film formation substrate (200) along a direction of scanning of the film formation substrate (200). The mask (60) is provided so that the long-side direction of the mask base material is perpendicular to the direction of scanning and that the exposed region is allowed to move in a direction perpendicular to the direction of scanning by rotation of a wind-off roll (91) and a wind-up roll (92).

9 Claims, 17 Drawing Sheets

VAPOR DEPOSITION DEVICE AND VAPOR DEPOSITION METHOD

CROSS REFERENCE TO RELATED APPLICATIONS

This is a U.S. National Phase patent application of PCT/JP2011/080354, filed Dec. 28, 2011, which claims priority to Japanese patent application no. 2011-002042, filed Jan. 7, 2011, each of which is hereby incorporated by reference in the present disclosure in its entirety.

TECHNICAL FIELD

The present invention relates to a vapor deposition method and a vapor deposition device each involving use of a mask for vapor deposition.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminescent layer made of an organic luminescent material which emits light of at least the above three colors.

Such formation of a luminescent layer pattern is performed by a method such as a vacuum vapor deposition method that uses a vapor deposition mask referred to as a shadow mask.

A mask is typically equivalent in size to a film formation substrate. When in use, the mask is fixed to a mask frame under tension for prevention of bending and distortion and is closely attached to the film formation substrate.

However, in a case where an organic EL display device is produced by such a vacuum vapor deposition method, a larger substrate size of a film formation substrate normally allows a larger number of panels to be formed from a single film formation substrate, and thus reduces the unit cost of a panel. This means that a larger sized film formation substrate allows an organic EL display device to be produced at a lower cost.

Unfortunately, a larger substrate size requires the mask to be larger in size as well. Such a larger size results in a gap opening between the film formation substrate and the mask due to self-weight bending and elongation of the mask. This makes it impossible to form a pattern with high positional accuracy, and thus causes misplacement in vapor deposition and color mixture, thereby making it difficult to achieve high resolution.

Further, a larger substrate size requires the mask and a mask frame that holds it to be both extremely large and heavy. This in turn requires a device that uses the mask to be extremely large and complex, which not only makes it difficult to design such a device, but also causes a safety problem in handling the mask during a production step or a step such as replacing the mask.

On the other hand, there has been known a method that performs vapor deposition by use of a mask which is smaller in size than a film formation substrate, so that a vapor-deposited film is formed on a large-sized film formation substrate that is used as the film formation substrate.

For example, Patent Literature 1 discloses a method that uses a mask which is smaller in size than a film formation substrate, the method performing vapor deposition over an entire surface of the film formation substrate while shifting the mask and a vapor deposition source relative to the film formation substrate.

Thus, the use of a vapor deposition mask which is smaller in size than a film formation substrate solves the problem caused by the use of a mask equivalent in size to a film formation substrate.

Citation List

[Patent Literatures]

Patent Literature 1

Japanese Patent Application Publication, Tokukai, No. 2004-349101 A (Publication Date: Dec. 9, 2004)

Patent Literature 2

Japanese Patent Application Publication, Tokukai, No. 2002-235166 A (Publication Date: Aug. 23, 2002)

Patent Literature 3

Japanese Patent Application Publication, Tokukai, No. 2003-133067 A (Publication Date: May 9, 2003)

SUMMARY OF INVENTION

Technical Problem

Unfortunately, the use of the mask which is smaller in size than a film formation substrate increases a frequency of occurrence of clogging of the mask is likely to decrease positional accuracy in vapor deposition. The reason for this will be described below with reference to (a) and (b) of FIG. 17.

(a) and (b) of FIG. 17 illustrate the problem that arises in a case where vacuum vapor deposition is carried out with use of a mask for vapor deposition. (a) of FIG. 17 is a cross-sectional view illustrating how a vapor-deposited object is built up on the mask and the film formation substrate during the vapor deposition, and (b) of FIG. 17 is an enlarged view of an area which is indicated by a chain-double-dashed line illustrated in (a) of FIG. 17.

As illustrated in (a) of FIG. 17, a mask 60 for vapor deposition is provided with openings 61 so that a vapor-deposited film 211 is formed in only a desired vapor deposition region on the film formation substrate 200. A pattern of a luminescent layer is formed by causing vapor deposition particles emitted from the vapor deposition source 70 to be deposited with respect to the film formation substrate 200 through the openings 61 which are provided in the mask 60.

As described above, since regions other than the desired vapor deposition region of the film formation substrate 200 are generally shielded by the mask 60 during the vapor deposition, repeated vapor depositions cause a gradual build up of the vapor-deposited object 212 on the mask 60 as illustrated in (b) of FIG. 17. The opening 61 of the mask 60 is no exception to such a phenomenon. A gradual build up of the vapor-deposited object 212 on an inner wall of the opening 61 of the mask 60 causes an opening width of the opening 61 to gradually become smaller than its intended design value. This in turn causes a decrease in vapor deposition accuracy.

In particular, in the case where vapor deposition is carried out with respect to an entire surface of a film formation substrate by carrying out scanning with use of a mask which is smaller in size than a film formation substrate as in the case of Patent Literature 1, the amount of vapor-deposited object adhered to the mask is larger as compared to a case where a mask which is identical in size to the film formation substrate is used.

Further, in the case where a mask which is identical in size to a film formation substrate is used and brought into contact with the film formation substrate so as to be integrated with the film formation substrate as in the case of the conventional technique, the mask can be removed/replaced simultaneously with the removal of the film formation substrate. However, in the case where vapor deposition is carried out with respect to an entire surface of a film formation substrate by carrying out scanning with use of a mask which is smaller in size than a film formation substrate as in the case of Patent Literature 1, the mask and the film formation substrate are independent from each other. This requires the mask and the film formation substrate to be replaced by means of different mechanisms.

Thus, in the case where vapor deposition is carried out with respect to an entire surface of the film formation substrate by carrying out scanning with use of the mask which is smaller in size than the film formation substrate as in the case of Patent Literature 1, it is difficult to carry out replacement of the mask. This results in decrease in throughput and decrease in maintainability at mass production.

The present invention has been attained in view of the above problems. An object of the present invention is to provide a vapor deposition method and a vapor deposition device both of which achieve a high patterning accuracy and yield a high throughput.

Solution to Problem

In order to solve the above problem, a vapor deposition device in accordance with the present invention is a vapor deposition device for forming a film having a predetermined pattern on a film formation substrate on which the film is to be formed, by depositing vapor deposition particles onto the film formation substrate through an opening of a vapor deposition mask, the vapor deposition device including: a substrate holding member holding the film formation substrate; a mask unit for forming the film having the predetermined pattern on the film formation substrate; and moving means for moving at least a first one of the mask unit and the substrate holding member relative to a second one so as to carry out scanning, the mask unit comprising: (i) a vapor deposition source operative to inject vapor deposition particles; (ii) a vapor deposition mask being constituted by a flexible mask base material having patterns periodically formed along a long-side direction of the mask base material, the patterns being identical in form to each other and each including the opening, wherein the vapor deposition mask is fixed in position relative to the vapor deposition source so that a direction perpendicular to a direction of scanning of the film formation substrate is the long-side direction of the mask base material, and a length of the mask base material along a direction perpendicular to the long-side direction of the mask base material is shorter than a length of the film formation substrate along the direction of scanning of the film formation substrate; (iii) a wind-off roll, provided at one of opposite ends of the vapor deposition mask which ends are positioned along the long-side direction of the vapor deposition mask, operative to wind the vapor deposition mask therearound; (iv) a wind-up roll, provided at the other end of the vapor deposition mask, operative to wind up the vapor deposition mask; and (v) at least a pair of mask-to-substrate distance adjusting members, the at least a pair of mask-to-substrate distance adjusting members operative to adjust a distance between the film formation substrate and a portion of the vapor deposition mask which portion lies between the at least a pair of mask-to-substrate distance adjusting members, in such a manner that at least one of the at least pair of mask-to-substrate distance adjusting members moves the vapor deposition mask in a direction perpendicular to a substrate surface of the film formation substrate, the vapor deposition mask being provided so that a region having a one-period pattern of a plurality of period patterns of the mask base material is so exposed as to be held in parallel to the film formation substrate by the mask-to-substrate distance adjusting members, that other region having the other period patterns is wound around the wind-off roll and the wind-up roll, and that the exposed region of the vapor deposition mask is allowed to move in the direction perpendicular to the scanning direction by rotation of the wind-off roll and the wind-up roll.

The above arrangement eliminates adhesion of the vapor deposition particles on the mask base material wound around the wind-off roll and the wind-up roll, during the vapor deposition carried out while at least a first one of the film formation substrate and the mask unit is moved relative to a second one. Thus, with the wind-off roll and the wind-up roll provided along the long-side direction of the mask base material, it is possible to carry out vapor deposition while at least a first one of the film formation substrate and the mask unit is moved relative to a second one, with use of a vapor deposition mask constituted by a mask base material having a length that extends along a direction perpendicular to a long-side direction of the mask base material and that is shorter than a length of the film formation substrate along the direction of scanning of the film formation substrate.

Further, the above arrangement allows shortening a mask length that extends along the scanning direction, thus downsizing a mask and preventing the mask from being bent by weight of the mask itself.

Still further, according to the above arrangement, it is possible to carry out sequential updating of the exposed region (a flattened surface of the mask) of the vapor deposition mask to the region including an unused one-period pattern (fresh surface), with use of the vapor deposition mask wound around the wind-off roll and the wind-up roll as described above.

Thus, it is possible to carry out updating to a mask pattern which has openings of a high level of integrity while maintaining a vacuum in the film growing chamber and without a need for removing the vapor deposition mask from the vapor deposition device. In addition, it is possible to carry out vapor deposition with respect to a long batch of substrate, with a simple structure.

Moreover, according to the above arrangement, exposure (mask updating) of the region including an unused one-period pattern can be carried out very easily because all that is required to make such mask updating is to wind up and off the vapor deposition mask (i.e. winding-off/winding-up). Therefore, it is possible to carry out frequent mask updatings. Consequently, it is possible to resolve the clogging problem which arises in the conventional technique.

Further, the used vapor deposition mask, which is formed into a roll form, can be easily retrieved from the device. Besides, the vapor deposition mask itself allows easy installation.

Thus, the above arrangement can achieve shortening a time required for mask replacement, throughput enhancement, and cost reduction.

Further, since the vapor deposition mask is easy to handle as described above, the vapor deposition mask has an advantage of increasing its workability, for example, in a case where the organic material adhered to the surface of the vapor deposition mask is to be collected.

According to the above arrangement, it is therefore possible to provide a vapor deposition device which achieves a high patterning accuracy and yields a high throughput.

Further, the vapor deposition method in accordance with the present invention is a vapor deposition method for forming a film having a predetermined pattern on a film formation substrate with use of the above-described vapor deposition device in accordance with the present invention, the vapor deposition method including the steps of: (i) moving at least a first one of the mask unit and the substrate holding member relative to a second one in a state in which rotations of a wind-off roll and a wind-up roll are stopped, so as to carry out vapor deposition; and (ii) carrying out mask updating by, when the mask unit meets a predetermined criterion for updating, rotating the wind-off roll and the wind-up roll to expose a region of a vapor deposition mask which region has an unused one-period pattern.

According to the above method, it is therefore possible to provide a vapor deposition method which achieves a high patterning accuracy and yields a high throughput.

Advantageous Effects of Invention

As described above, according to the present invention, the vapor deposition mask is constituted by the mask base material having patterns periodically formed which patterns are identical in form to each other and each include an opening for forming a film formation pattern, wherein the mask base material, except for its region having a one-period pattern which is held by the mask-to-substrate distance adjusting members, is wound around the wind-off roll and the wind-up roll, a length of the mask base material along a direction perpendicular to a long-side direction of the mask base material is shorter than a length of the film formation substrate along a direction of scanning of the film formation substrate, and vapor deposition is carried out in such a manner that the vapor deposition mask is provided so that the long-side direction of the mask base material is perpendicular to the direction of scanning.

This makes it possible to shorten a mask length that extends along the scanning direction. This makes it possible to downsize a mask and to prevent the mask from being bent by weight of the mask itself.

Further, according to the present invention, every time the vapor deposition device meets a predetermined criterion for updating, mask updating is carried out by a winding-up/winding-off method by which the wind-off roll and the wind-up roll are rotated so that the exposed region of the vapor deposition mask is moved in a direction perpendicular to the scanning direction.

Thus, it is possible to sequentially update the exposed region of the vapor deposition mask to a region including an unused one-period pattern while maintaining a vacuum in the film growing chamber and without a need for removing the vapor deposition mask from the vapor deposition device.

Moreover, the above-described updating (mask updating) can be carried out very easily because all that is required to make such mask updating is to wind up and off the vapor deposition mask. Further, the used vapor deposition mask, which is formed into a roll form, can be easily retrieved from the device. Besides, the vapor deposition mask itself allows easy installation.

Thus, according to the present invention, it is possible to carry out updating to a mask pattern which has openings of a high level of integrity. It is also possible to achieve shortening a time required for mask replacement, throughput enhancement, and cost reduction.

Consequently, according to the present invention, it is possible to provide a vapor deposition device and a vapor deposition method both of which achieve a high patterning accuracy and yield a high throughput.

Figure 16:
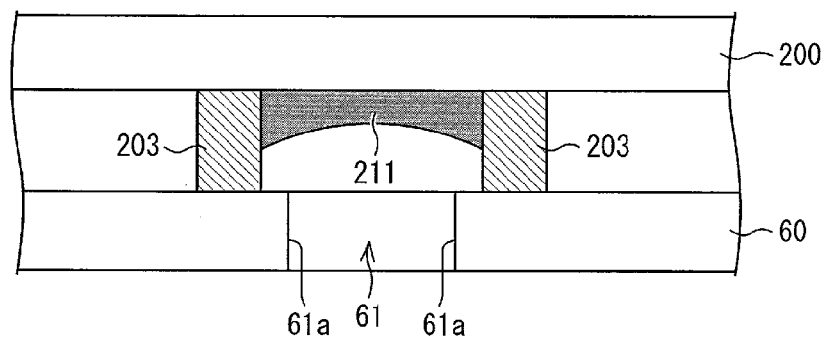
Figure 16:
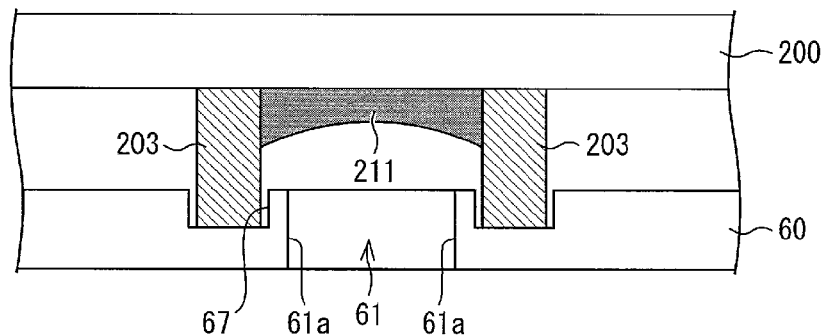

(a) and (b) of FIG. 16 are cross-sectional views illustrating how a film formation substrate and a mask used in Embodiment 6 of the present invention are arranged in the vicinity of one of the openings of the mask for vapor deposition in a state in which the film formation substrate and the mask are in contact with each other.

Figure 17:
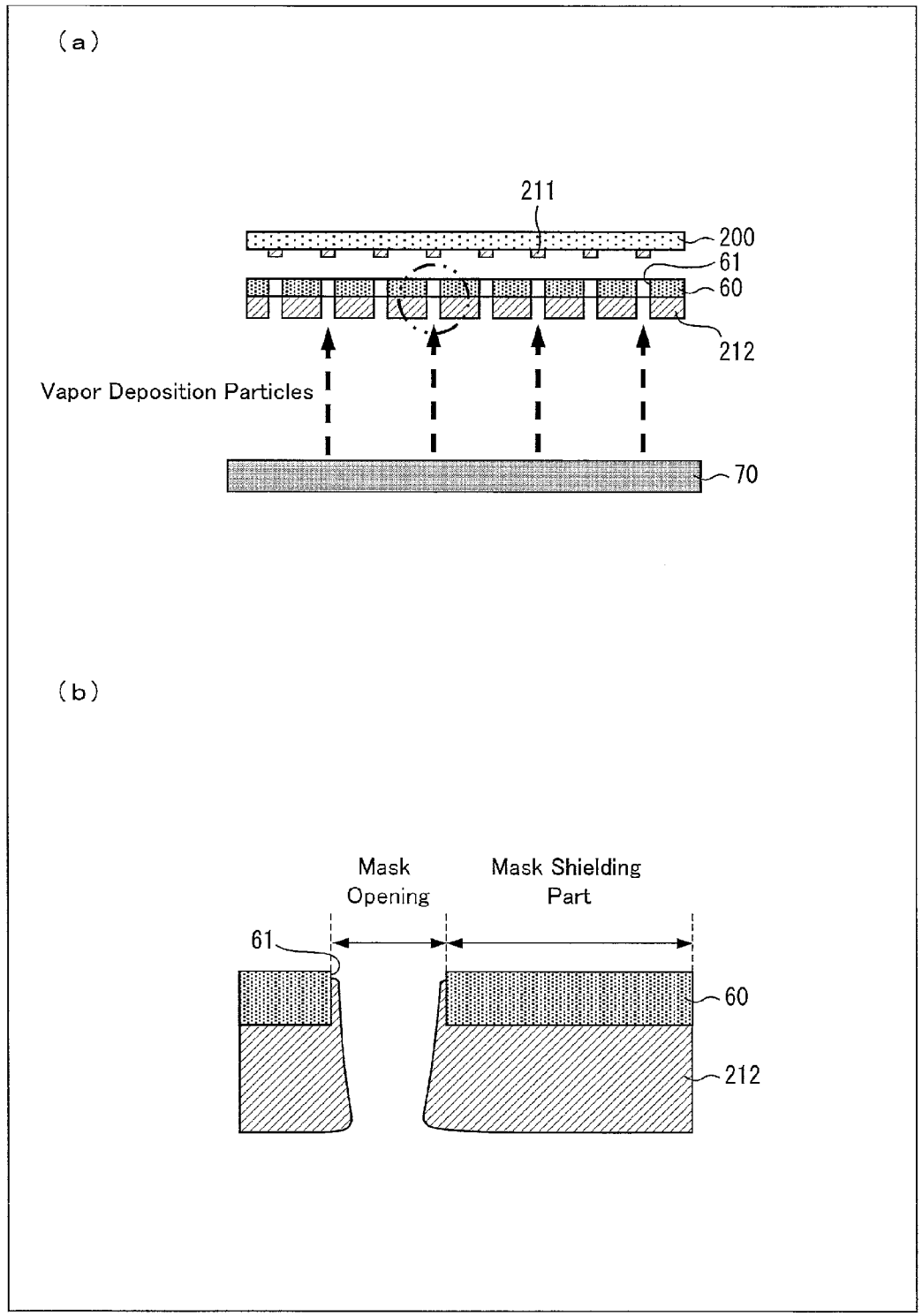

(a) and (b) of FIG. 17 illustrate the problem that arises in a case where vacuum vapor deposition is carried out with use of a mask for vapor deposition. (a) of FIG. 17 is a cross-sectional view illustrating how a vapor-deposited object is built up on the mask and a film formation substrate during the vapor deposition, and (b) of FIG. 17 is an enlarged view of an area which is indicated by a chain-double-dashed line illustrated in (a) of FIG. 17.

DESCRIPTION OF EMBODIMENTS

Embodiments of the present invention will be described in detail below.

[Embodiment 1]

The following description will discuss an embodiment of the present invention with reference to FIGS. 1 through 11.

Figure 1:
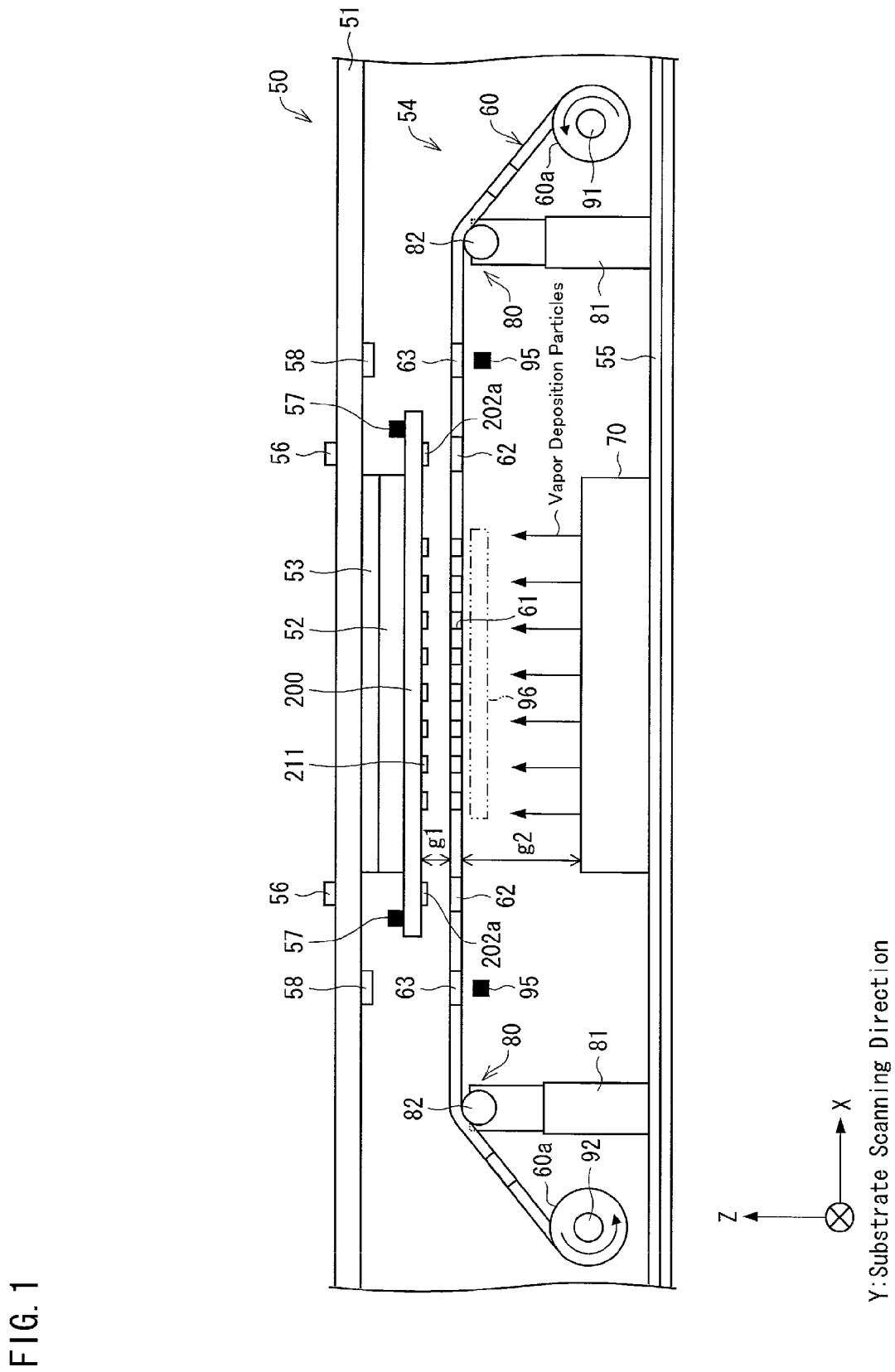
FIG. 1 is a cross-sectional view schematically illustrating a configuration of a main part of a vapor deposition device in accordance with Embodiment 1 of the present invention.
Figure 2:
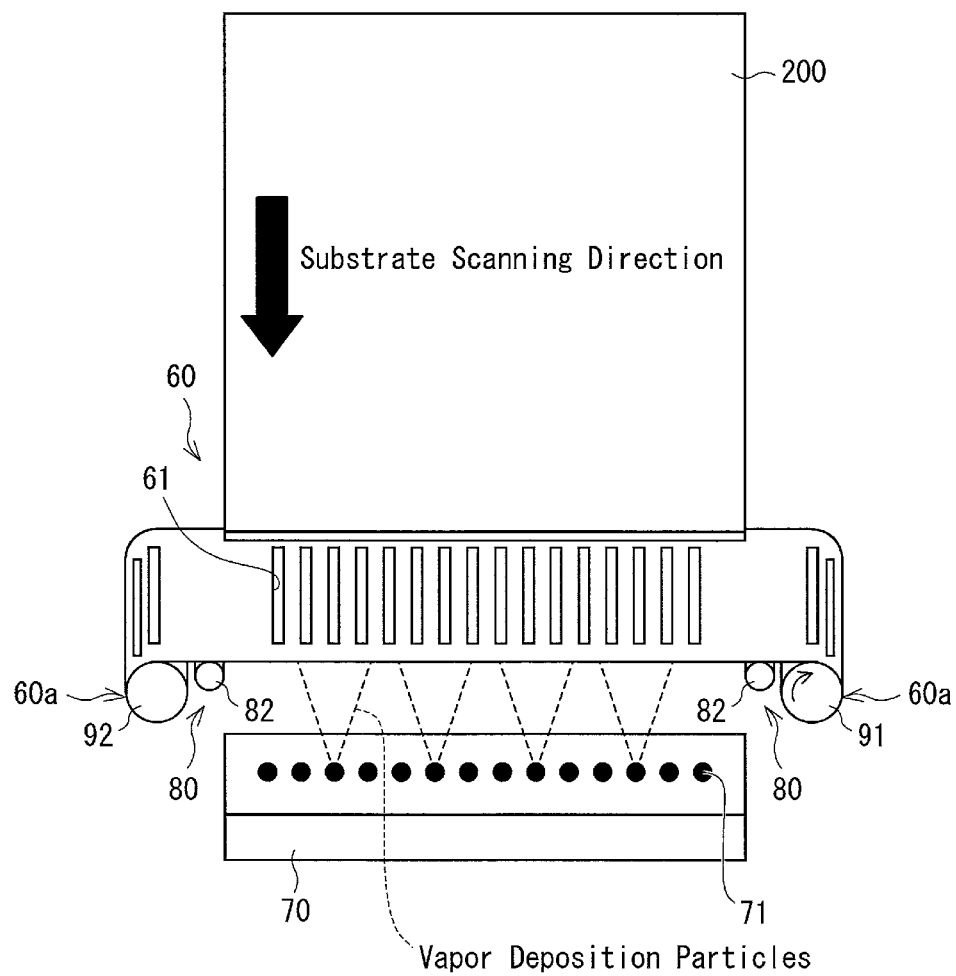
FIG. 2 is a perspective view illustrating how main components in a vacuum chamber of the vapor deposition device in accordance with Embodiment 1 of the present invention are related with one another in a case where the main components are viewed from obliquely above.
Figure 2:
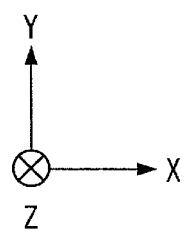
Figure 3:
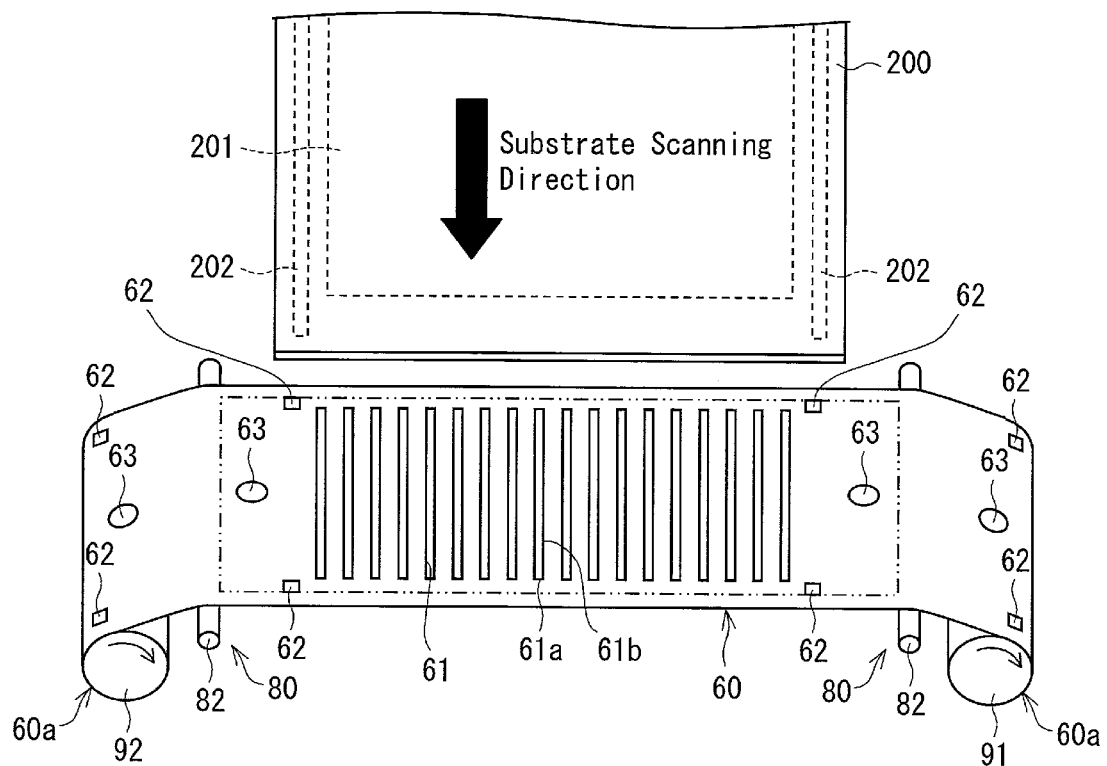
FIG. 3 is a perspective view schematically illustrating a mask and components around the mask of the vapor deposition device in accordance with Embodiment 1 of the present invention.
Figure 3:
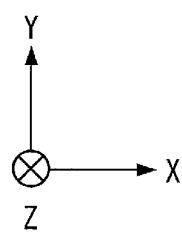
Figure 6:
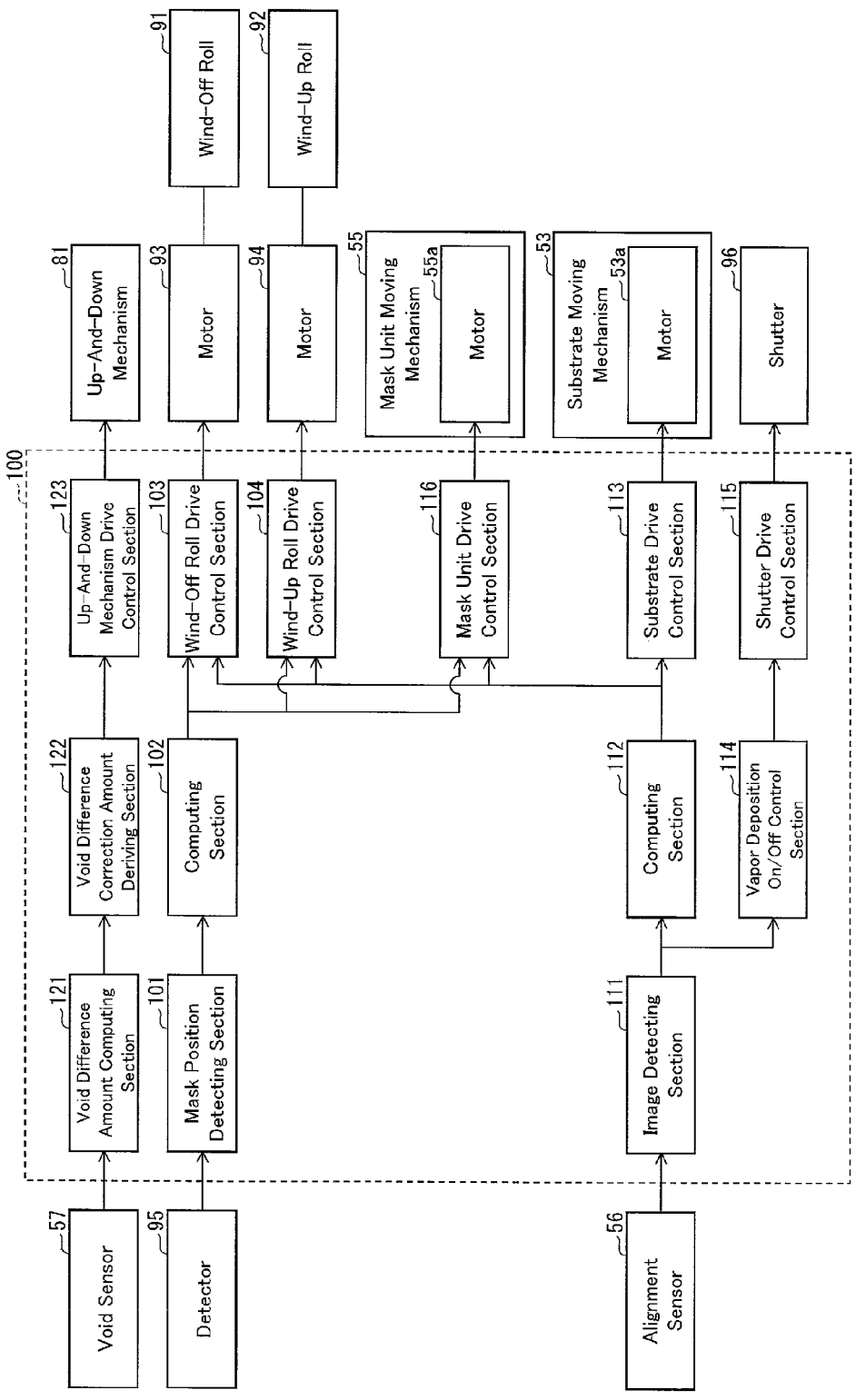
FIG. 6 a block diagram partially illustrating a configuration of the vapor deposition device in accordance with Embodiment 1 of the present invention.

FIG. 1 is a cross-sectional view schematically illustrating a configuration of a main part of a vapor deposition device in accordance with the present embodiment. FIG. 2 is a perspective view illustrating how main components in a vacuum chamber of the vapor deposition device in accordance with the present embodiment are related with one another in a case where the main components are viewed from obliquely above. FIG. 3 is a perspective view schematically illustrating a mask and components around the mask of the vapor deposition device in accordance with the present embodiment. FIG. 6 a block diagram partially illustrating a configuration of the vapor deposition device in accordance with the present embodiment.

FIG. 1 illustrates a state in which scanning has been further carried out from a state illustrated in FIG. 2. In FIG. 2, markers and the like are omitted and the mask is simplified.

<Overall Configuration of Vapor Deposition Device>

As illustrated in FIG. 1, a vapor deposition device 50 in accordance with the present embodiment includes: a vacuum chamber 51 (film growing chamber); a substrate holder 52 which serves as a substrate holding member for holding a film formation substrate 200 on which a film is to be formed; a substrate moving mechanism 53 (substrate moving means) for moving the film formation substrate 200; a mask unit 54; a mask unit moving mechanism 55 (mask unit moving means) for moving the mask unit 54; alignment sensors 56; and void sensors 57. The vapor deposition device 50 further includes a control circuit 100 (illustrated in FIG. 6) which serves as control means.

As illustrated in FIG. 1, the substrate holder 52, the substrate moving mechanism 53, the mask unit 54, the mask unit moving mechanism 55, and the void sensors 57 are provided inside the vacuum chamber 51.

On the other hand, the alignment sensors 56 and the control circuit 100 are provided outside the vacuum chamber 51.

The vacuum chamber 51 is provided with a vacuum pump (not shown) for vacuum-pumping the vacuum chamber 51 via an exhaust port (not shown) of the vacuum chamber 51 to keep a vacuum in the vacuum chamber 51 during vapor deposition.

First, a configuration of the mask unit 54 is described in detail.

<Overall Configuration of Mask Unit 54>

As illustrated in FIGS. 1 through 5, the mask unit 54 includes: a mask 60 (vapor deposition mask) for vapor deposition called shadow mask; a vapor deposition source 70; at least a pair of mask-to-substrate distance adjusting members 80; a wind-off roll 91; a wind-up roll 92; detectors 95 for use in an absolute alignment of the mask; a shutter 96; and the like.

<Configuration of Mask 60>

The mask 60 has a long shape (belt shape). As illustrated in FIGS. 2 and 3, the mask 60 has a long side with a width larger than the width of a side of the film formation substrate 200 which side is parallel to the long side, and the mask 60 has a short side with a width smaller than the width of a side of the film formation substrate 200 which side is parallel to the short side.

In the present embodiment, the mask 60 is arranged so that the long-side direction of the mask 60 is orthogonal to a scanning direction of the film formation substrate 200 or the mask unit 54.

That is, in the present embodiment, the mask 60 is such a mask 60 that a length of the mask 60 in a direction perpendicular to the long-side direction of the mask 60 (i.e., a mask length that extends along the substrate scanning direction) is smaller than a length, in the scanning direction, of the film formation substrate 200, and vapor deposition is carried out by moving at least a first one of the film formation substrate 200 and the mask unit 54 relative to a second one thereof.

As illustrated in FIGS. 1 through 3, one of end sections of the mask 60 in the long-side direction of the mask 60 is wound around the wind-off roll 91, and the other one of the end sections of the mask 60 in the long-side direction of the mask 60 is wound around the wind-up roll 92 into a roll shape. Thus, both end sections of the mask 60 in the long-side direction thereof are wound up into a roll shape.

Configurations of the wind-off roll 91 and the wind-up roll 92 will be later described in detail. The portions of the mask 60 which portions are wound up into a roll shape will be hereinafter collectively referred to as "mask roll section 60a".

The mask 60 needs to have flexibility so as to be wound up into a roll shape as described above.

It is therefore preferable that the mask 60 has a thickness of about not more than several hundreds of micrometers, in a case where the mask 60 is made of a metal mask base material such as, for example, invar or a stainless material. Note, however, that a material of the mask 60 is not limited to this, and can be a film made of a material (e.g., polyethylene) other than a metal material.

Figure 4:
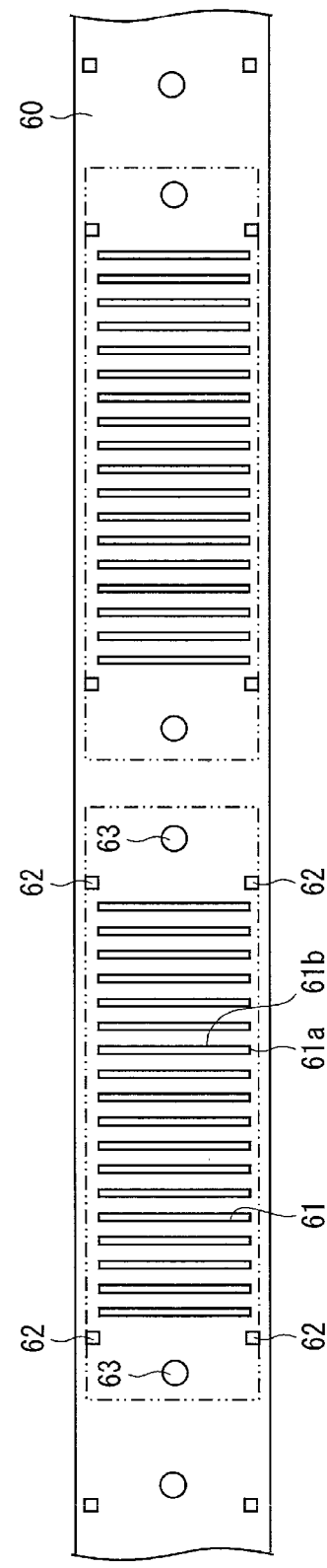
FIG. 4 is a plan view illustrating a pattern formed on a mask of the vapor deposition device in accordance with Embodiment 1 of the present invention.

FIG. 4 is a plan view illustrating a pattern (mask pattern) formed on the mask 60.

As illustrated in FIG. 4, the mask 60 has patterns which are identical in form to each other and formed periodically and repeatedly along the long-side direction of the mask 60

The mask 60 is constituted by the mask base material having patterns which are identical in form to each other and periodically formed along the long-side direction of the mask base material.

A pattern corresponding to each repetition (i.e., a one-period pattern within a chain double-dashed line in FIGS. 3 and 4) includes (a) openings 61 (through holes) for actually forming a vapor-deposited film 211 on the film formation substrate 200 and (b) alignment markers 62 for alignment between the film formation substrate 200 and the mask 60. The one-period pattern preferably includes absolute-alignment markers 63 for use in an absolute alignment between the mask 60 and the vapor deposition device 50.

The mask 60 is constituted by connecting one-period patterns with each other. Among a plurality of one-period patterns formed on the mask 60, a one-period pattern is exposed and the other one-period patterns are wound around the wind-off roll 91 and the wind-up roll 92 at the mask roll section 60a. The plurality of repeated one-period patterns are used appropriately by being exposed sequentially on a period by period basis.

One-period pattern being exposed is used for forming a film formation pattern on the film formation substrate 200. The one-period pattern being exposed is held by the mask-to-substrate distance adjusting members 80 so that the one-period pattern is maintained parallel to the film formation substrate 200.

<Configuration of Mask Pattern>

As illustrated in FIGS. 2 and 4, the mask 60 has a plurality of openings 61 which are, for example, in a stripe shape and are arranged on a long mask board in a one-dimensional direction in correspondence with the film formation pattern of the vapor-deposited film 211 to be formed on the film formation substrate 200.

As illustrated in FIGS. 1 through 3, the openings 61 are provided so that the long-side direction of each of the openings 61 is parallel to the scanning direction, and the openings 61 are arranged side by side in a direction orthogonal to the substrate scanning direction. In the present embodiment, the openings 61 each extending in parallel to the short-side direction (a direction perpendicular to the long-side direction) of the mask 60 are arranged side by side in the long-side direction of the mask 60.

It is preferable that, as illustrated in FIGS. 1, 3, and 4, alignment markers 62 for use in an alignment between the film formation substrate 200 and the mask 60 are provided at opposite end sections of the exposed one-period pattern which opposite end sections are located downstream in the direction in which the substrate makes its entry (that is, opposite end sections of the one-period pattern which opposite end sections are located upstream in the substrate scanning direction).

In a case where reciprocating vapor deposition is carried out, alignment markers 62 are preferably located at both opposite end sections along the substrate scanning direction (that is, at four corners).

That is, in a case where vapor deposition is carried out in the substrate scanning direction indicated by an arrow in FIG. 3, the alignment between the film formation substrate 200 and the mask 60 is carried out with use of two alignment markers 62 of the one-period pattern within the chain double-dashed line in FIG. 3 which two alignment markers 62 are located upstream in the substrate scanning direction in FIG. 3.

In a case where vapor deposition is carried out in a direction opposite to the substrate scanning direction indicated by the arrow in FIG. 3, the alignment between the film formation substrate 200 and the mask 60 is carried out with use of two alignment markers 62 of the one-period pattern within the chain double-dashed line in FIG. 3 which two alignment markers 62 are located downstream in the substrate scanning direction in FIG. 3.

The film formation substrate 200 has, as indicated by the dotted line in FIG. 3, alignment marker sections 202 which are provided outside a panel region 201 and along the scanning direction (substrate scanning direction) of the film formation substrate 200 and in which respective alignment markers 202a (see FIG. 1) for use in an alignment between the film formation substrate 200 and the mask 60 are provided.

A substrate position is corrected with use of the alignment markers 62 and 202a before the film formation substrate 200 enters a vapor deposition area, which is an area above the mask 60 where vapor deposition particles outputted from the vapor deposition source 70 are deposited on the film formation substrate 200.

Thus, the alignment marker sections 202 of the film formation substrate 200 are preferably provided, as illustrated in FIG. 3, such that (i) an alignment marker section 202 is located away, downstream in the substrate scanning direction, from the panel region 201, which is a region for vapor deposition (a region in which the film formation pattern is formed) and that (ii) in a case where reciprocating vapor deposition is carried out, an alignment marker section 202 is located away, upstream in the substrate scanning direction, from the panel region 201.

In other words, the alignment markers 202a are preferably located away, downstream and upstream in the substrate scanning direction respectively, from respective opposite end sections of the panel region 201 which opposite end sections are juxtaposed along the substrate scanning direction.

Instead of or as well as locating the alignment markers 202a away in the substrate scanning direction from the panel region 201, it is possible to locate the alignment markers 62 of the mask 60 outside relative to the openings 61, as illustrated in FIG. 4.

This arrangement makes it possible to adjust the mask 60 for alignment, and thus carry out an alignment between the alignment markers 62 and the alignment markers 202a before vapor deposition is carried out with respect to the film formation substrate 200.

Note that the alignment markers 62 and 202a are not particularly limited to any specific shape, material, size, and forming method, and a technique that is in common use can be applied.

Figure 5:
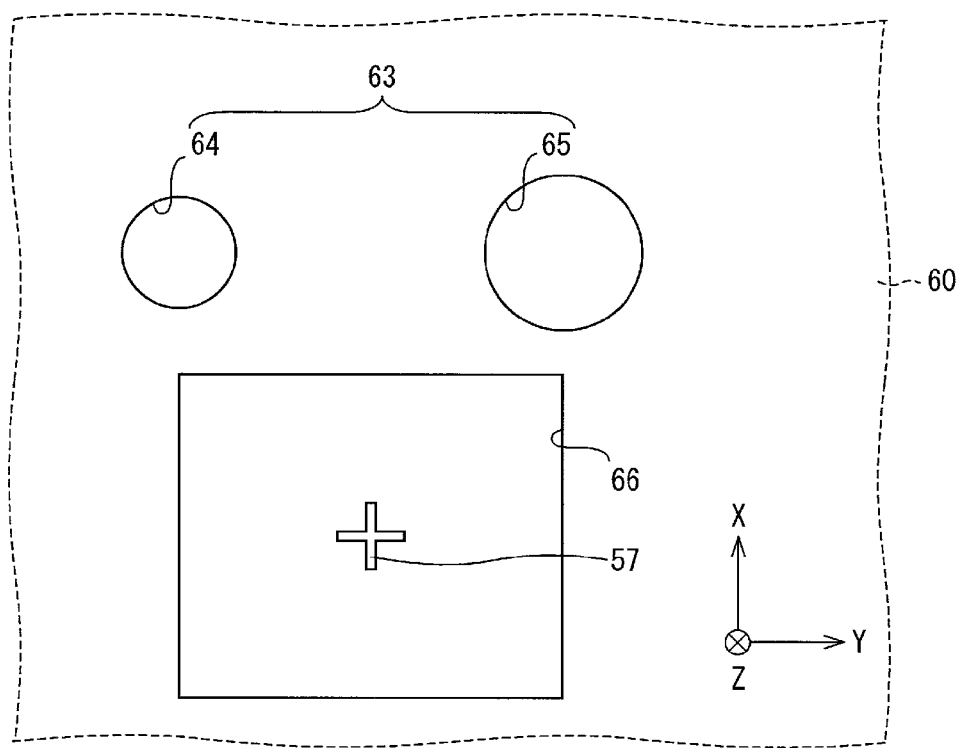
FIG. 5 is a plan view of an absolute-alignment marker of the pattern illustrated in FIG. 4 as viewed from a detector which detects a mask absolute-alignment marker in the vapor deposition device in accordance with Embodiment 1 of the present invention.

FIG. 5 is a plan view of an absolute-alignment marker 63 as viewed from a detector 95 which detects a mask absolute-alignment marker.

The absolute-alignment markers 63 are simplified in FIGS. 3 and 4. As illustrated in FIG. 5, the mask 60 is provided thereon with, as each of the absolute-alignment markers 63, (i) alignment markers 64 and 65 and (ii) an opening 66.

As illustrated in FIGS. 1 and 5, absolute alignment reference markers 58 corresponding to an absolute position of the mask 60 are provided in the vacuum chamber 51.

The above absolute position is determined, in advance at a designing stage, in relation to the device on the basis of either (i) the respective positions of the mask 60 and the vapor deposition device 50 relative to each other or (ii) the respective positions of the mask 60 and the vapor deposition source 70 relative to each other, so that no portion of the shadow mask 60 is placed outside the vapor deposition region 201 of the film formation substrate 200.

As illustrated in FIG. 5, the opening 66 serves as a window section through which to see an absolute alignment reference marker 58.

The alignment markers 64 and 65 are, for example, two openings: one is larger than the other. The alignment markers 64 and 65 are provided along a Y-axis direction, which is the substrate scanning direction (that is, the short-side direction of the mask 60) in parallel to the Y-axis direction.

One of the alignment markers 64 and 65 serves as an alignment center, while the other is used to check a direction parallel to the substrate scanning direction.

The mask 60 is provided with, in the vicinity of the alignment markers 64 and 65, the above-mentioned opening 66 to read the absolute alignment reference marker 58 with use of the detector 95. The absolute alignment reference marker 58 can be seen through the opening 66.

FIGS. 1 through 4 each illustrate an example case in which the openings 61 each having a rectangular shape are provided in a stripe shape on the mask 60 along the substrate scanning direction.

The shape of the openings 61 can, however, be simply set as appropriate to form a desired vapor deposition pattern, and is thus not particularly limited to any specific one.

The openings 61 may each have the shape of, for example, a slot. In any case, the openings 61 desirably each extend in a direction that is, in the case where the film formation substrate 200 is an array substrate such as a TFT substrate, identical to the column direction of sub-pixels provided in the shape of a stripe and having an identical color.

<Arrangement of Vapor Deposition Source 70>

The vapor deposition source 70 is located below the mask 60. Although the mask 60 and the vapor deposition source 70 are fixed in position relative to each other, there is a minute operating region due to an alignment process.

The vapor deposition source 70 and the mask-to-substrate distance adjusting members 80 are only required to be arranged so that the mask 60 is held and fixed in a position away from the vapor deposition source 70 by a fixed distance. The vapor deposition source 70 and the mask-to-substrate distance adjusting members 80 may be fixed to a holder unit (not shown), or may be fixed directly to the mask unit moving mechanism 55.

In a case where the film formation substrate 200 is moved relative to the mask unit 54 which is fixed, the mask 60 and the vapor deposition source 70 simply need to be fixed in position relative to each other, but do not necessarily need to be integrated with each other.

The mask unit 54 may be arranged, for example, such that (i) the vapor deposition source 70 and the mask-to-substrate distance adjusting members 80 are each fixed to an inner wall of the vacuum chamber 51, the mask 60 and the vapor deposition source 70 are fixed in position relative to each other.

A gap g2 between the mask 60 and the vapor deposition source 70 can be set to any length and is not particularly limited. For improvement in efficiency of use of the vapor deposition material, however, the gap g2 is desirably as small as possible and is set, for example, to about 100 mm.

<Configuration of Vapor Deposition Source 70>

The vapor deposition source 70 is, for example, a container that contains a vapor deposition material. The vapor deposition source 70 may be a container that itself contains a vapor deposition material or a container that includes a load-lock pipe.

As with the mask 60, the vapor deposition source 70 has, for example, a rectangular shape (belt shape) as illustrated in FIG. 1. As illustrated in FIG. 2, the vapor deposition source 70 has, on a surface facing the mask 60, a plurality of injection holes 71 for emitting (scattering) the vapor deposition material in the form of vapor deposition particles.

The injection holes 71 are, as illustrated in FIG. 2, provided next to one another along the direction in which the openings 61 of the mask 60 are arranged next to one another.

The injection holes 71 may each have a pitch that is unequal to the pitch of an opening 61. The injection holes 71 may each have a size that is unequal to the size of an opening 61.

For example, in a case where, as illustrated in FIG. 1, the mask 60 has the stripe-shaped openings 61, the injection holes 71 may have an opening diameter that is larger or smaller than the width of a short side 61a of the openings 61.

In addition, a plurality of injection holes 71 may be provided to correspond to a single opening 61, whereas a single injection hole 71 may be provided to correspond to a plurality of openings 61. Further, at least one of a plurality of injection holes 71 or a partial region of an injection hole 71 may be provided to face a non-opening section (for example, between adjacent openings 61 and 61) of the mask 60.

To reduce the number of vapor deposition particles adhering to a non-opening section of the mask 60 and thus improve material use efficiency as much as possible, the injection holes 71 are preferably provided to face the openings 61 in such a manner that at least a portion of each injection hole 71 coincides with one or more openings 61.

Further, the injection holes 71 are more preferably provided to (i) face the openings 61 and (ii) each positioned inside one of the openings 61 in a plan view.

To improve material use efficiency, the openings 61 and the injection holes 71 are desirably provided in a one-to-one correspondence with each other.

FIG. 2 illustrates an example case in which both (i) the openings 61 of the mask 60 and (ii) the injection holes 71 of the vapor deposition source 70 are arranged one-dimensionally (that is, in a linear manner).

The present embodiment is, however, not limited to such an arrangement. It is alternatively possible to arrange both the openings 61 of the mask 60 and the injection holes 71 of the vapor deposition source 70 two-dimensionally (that is, in a planar manner).

FIGS. 1 through 4 illustrate an example case involving a plurality of openings 61 in the mask 60 and a plurality of injection holes 71 in the vapor deposition source 70. The present embodiment is, however, not limited to such an arrangement. The mask 60 is simply required to include at least one opening 61, whereas the vapor deposition source 70 is simply required to include at least one injection hole 71.

In other words, the present embodiment may alternatively be arranged such that the mask 60 includes only one opening 61 and that the vapor deposition source 70 includes only one injection hole 71.

Even this arrangement makes it possible to form a predetermined pattern on the film formation substrate 200 by (i) moving at least a first one of the mask unit 54 and the film formation substrate 200 relative to the second one and (ii) sequentially depositing vapor deposition particles onto the panel region 201 of the film formation substrate 200 through the openings 61 of the mask 60.

There is no particular limit to the respective numbers of the openings 61 and the injection holes 71. The numbers can each be set as appropriate in accordance with, for example, the size of the film formation substrate 200.

<Configuration of Mask-to-Substrate Distance Adjusting Members 80>

The mask-to-substrate distance adjusting members 80 each include, as illustrated in FIG. 1, an up-and-down mechanism 81 (moving mechanism, sliding mechanism), and a mask holding member 82 held by the up-and-down mechanism 81.

The mask-to-substrate distance adjusting members 80 can adjust a distance (gap g1; g1≥0) between the mask 60 and the film formation substrate 200 by slightly raising or lowering the mask holding members 82 by means of the up-and-down mechanisms 81.

The up-and-down mechanisms 81 are each suitably, for example, an actuator, a slider, or the like which converts a control signal into a movement in a Z-axis direction (up-and-down direction).

In order not to prevent the wind-off roll 91 from winding off the mask 60 and prevent the wind-up roll 92 from winding up the mask 60, each of the mask holding members 82 preferably includes a rotation mechanism. The mask holding members 82 are each suitably, for example, a roller which is provided rotatably (e.g., a columnar roller which rotates in contact with the mask 60 and is longer than the length of the mask 60 along the short-side direction thereof, as illustrated in FIGS. 1 through 3).

The present embodiment is, however, not limited to such an arrangement. It is alternatively possible to arrange a plurality of mask-to-substrate distance adjusting members 80 along the short-side direction of the mask 60 (that is, in the scanning direction), as long as the film formation substrate 200 and the mask 60 can be maintained parallel to each other.

It is also possible to arrange guide rollers which assist adjustment of a distance between the mask and the substrate.

In a case where, as described above, columnar rollers (mask holding rollers) are used as the mask holding members 82, each of the mask holding members 82 may be held by an actuator in a central position, along an axial direction, of a columnar roller. The mask holding members 82 are, however, more preferably held by actuators at respective opposite end sections in the axial direction.

Similarly, in a case where sliders are used as the up-and-down mechanisms 81, the mask holding members 82 are more preferably arranged such that opposite end sections of a columnar roller in the axial direction are held by sliders.

This arrangement makes it possible to (i) more precisely control the gap g1 between the mask 60 and the film formation substrate 200 and (ii) locally control the void amount depending on the distribution of the void amount.

In order that a region of the mask 60 in which region the exposed one-period pattern is formed is maintained parallel to the film formation substrate 200 during vapor deposition, the mask holding members 82 are provided at positions outside a path for carrying the film formation substrate 200, in such a manner that the mask holding members 82 face each other so that end sections of the film formation substrate 200 in a direction perpendicular to a substrate carrying direction are sandwiched between the mask holding members 82 when viewed from a direction perpendicular to a mask surface and a substrate surface (for example, from above the film formation substrate 200) during vapor deposition.

FIGS. 1 through 3 illustrate an example case where a single mask-to-substrate distance adjusting member 80 is provided at each of the opposite ends of the exposed one-period pattern so that mask-to-substrate distance adjusting members 80 face the one-period pattern. The present embodiment is, however, not limited to such an arrangement, and may alternatively be arranged such that a plurality of mask-to-substrate distance adjusting members 80 are provided at each of the opposite ends of the exposed one-period pattern.

<Configurations of Wind-Off Roll 91 and Wind-Up Roll 92>

The wind-off roll 91 and the wind-up roll 92 are, as described above, provided at the opposite end sections of the mask 60 in the long-side direction so as to face each other with the exposed one-period pattern sandwiched between the wind-off roll 91 and the wind-up roll 92.

In other words, the wind-off roll 91 and the wind-up roll 92 are provided in regions outside the region in which the exposed one-period pattern is formed, in such a manner that a region of the mask 60 which region is held by the mask holding members 82 and in which region the exposed one-period pattern is formed is sandwiched between the wind-off roll 91 and the wind-up roll 92.

Accordingly, the wind-off roll 91 and the wind-up roll 92 are, as illustrated in FIGS. 1 through 3, provided at positions outside the path for carrying the film formation substrate 200, in such a manner that, when vapor deposition is carried out, the wind-off roll 91 and the wind-up roll 92 face each other so as to sandwich the end sections of the film formation substrate 200 in the direction perpendicular to the substrate carrying direction, when viewed from the direction perpendicular to the mask surface and the substrate surface.

The wind-off roll 91 and the wind-up roll 92 are provided in positions lower than the mask holding members 82 so that tension can be applied to the mask 60 with use of each of the mask holding members 82 as a fulcrum.

This allows that mask 60 to bend with use of each of the mask holding members 82 as a fulcrum.

In order that, during vapor deposition, vapor deposition particles do not adhere to the mask 60 (i.e., the mask roll section 60a) wound up around the wind-off roll 91 and the wind-up roll 92, the wind-off roll 91 and the wind-up roll 92 are preferably provided at positions outside the respective mask holding members 82 when viewed from the direction perpendicular to the mask surface and the substrate surface during vapor deposition.

In other words, the wind-off roll 91 and the wind-up roll 92 are preferably provided so that the mask 60 is inclined outward from the mask holding members 82 with use of each of the mask holding members 82 as a fulcrum.

The wind-off roll 91 and the wind-up roll 92 are only required to wind the mask 60 around the wind-off roll 91 and the wind-up roll 92, and are not limited to any specific size, arrangement, and material. In addition, (i) an angle at which the mask 60 is inclined as described above, and (ii) distances by which each of the wind-off roll 91 and the wind-up roll 92 is positioned away from the mask holding member 82 in the Z-axis direction and the X-axis direction, respectively, are not particularly limited.

The wind-off roll 91 winds off the mask 60, which is wound around the wind-off roll 91, by unwinding the mask 60.

On the other hand, the wind-up roll 92 winds up the mask 60, which has been unwound, in synchronization with (that is, operating together with) the taking off of the mask 60 from the wind-off roll 91.

The wind-off roll 91 and the wind-up roll 92 are, as illustrated in FIG. 6, connected with motors 93 and 94, respectively. Rotation and torque of the wind-off roll 91 and the wind-up roll 92 are controlled by the wind-off roll drive control section 103 and the wind-up roll drive control section 104 which are respectively connected with the motors 93 and 94.

The wind-off roll 91 and the wind-up roll 92 are controlled by the wind-off roll drive control section 103 and the wind-up roll drive control section 104 to wind off and wind up the mask 60, respectively. The wind-off roll 91 and the wind-up roll 92 can control tension applied to the mask 60.

The wind-off roll 91 and the wind-up roll 92 desirably have a set minimum tension (MIN) in order to prevent the mask 60 from being bent by tension applied thereto.

When the distance between the mask 60 and the film formation substrate 200 is adjusted by slightly raising and lowering the mask-to-substrate distance adjusting members 80, there is a change in tension applied to the mask 60. However, the wind-off roll 91 and the wind-up roll 92 control rotations of the wind-off roll drive control section 103 and the wind-up roll drive control section 104, respectively, to thereby cancel out the change.

According to the present embodiment, tension is applied to the mask 60, as described above, by means of the wind-off roll 91 and the wind-up roll 92 with use of each of the mask-to-substrate distance adjusting members 80 as a fulcrum. This makes it possible to carry out mask alignment and also eliminate curling of the mask 60 unwound.

<Configuration of Detector 95>

As illustrated in FIG. 1, the mask unit 54 includes the detectors 95 for use in an absolute alignment of the mask, each of which detectors 95 detects the position of an absolute alignment reference marker 58 via an absolute-alignment marker 63 provided in the exposed one-period pattern.

Each of the detectors 95 checks the position of an absolute alignment reference marker 58 via, as illustrated in FIG. 5, an opening 66 provided in an absolute-alignment marker 63.

According to the present embodiment, the detectors 95 detect the positions of the absolute alignment reference markers 58, as described above, via the absolute-alignment markers 63 provided in the exposed one-period pattern. This makes it possible to carry out absolute alignment of the mask 60 and also observe (i) an amount by which the mask 60 is wound off (an amount by which the mask 60 is pulled out of the wind-off roll 91) and (ii) the position of the mask 60 itself.

The detectors 95 are not limited to specific ones, and can each be, for example, various optical sensors such as an image sensor including a CCD and serving as an image sensing means (image reading means).

<Configuration of Shutter 96>

As indicated by the chain double-dashed line in FIG. 1, the shutter 96 may be provided, as necessary, to be capable of moving in a space between the mask 60 and the vapor deposition source 70 (that is, capable of being inserted between them) on the basis of a vapor deposition OFF signal or a vapor deposition ON signal, in order to control reaching of vapor deposition particles to the mask 60.

The shutter 96 is inserted between the mask 60 and the vapor deposition source 70 to close the openings 61 of the mask 60. Appropriately inserting the shutter 96 between the mask 60 and the vapor deposition source 70 can prevent vapor deposition on a non vapor deposition region for which vapor deposition is unnecessary.

The shutter 96 may be provided integrally with or separately from the vapor deposition source 70.

The vapor deposition device 50 is so adjusted that vapor deposition particles from the vapor deposition source 70 are scattered below the mask 60. The vapor deposition device 50 may be arranged such that vapor deposition particles scattered beyond the mask 60 are blocked as appropriate by, for example, a deposition preventing plate (shielding plate).

<Configuration of Substrate Holder 52>

The film formation substrate 200 made up of members such as a TFT substrate is so held by the substrate holder 52 as to have a film formation surface facing the mask 60 (vapor deposition mask) for deposition in the mask unit 54.

For example, the film formation substrate 200 and the mask 60 are placed to face each other and separated from each other by a fixed distance, and a gap g1 having a fixed height is provided between the film formation substrate 200 and the mask 60.

The present embodiment describes below an example case in which (i) the gap g1 (g1>0) having a fixed height is provided between the film formation substrate 200 and the mask 60 and (ii) vapor deposition is carried out by maintaining a fixed gap g1 between the film formation substrate 200 and the mask 60.

The substrate holder 52 is suitably, for example, an electrostatic chuck or the like. Fixing the film formation substrate 200 to the substrate holder 52 by a technique involving the electrostatic chuck or the like allows the film formation substrate 200 to be held by the substrate holder 52 in a state in which there is no self-weight bending in the film formation substrate 200.

<Configurations of Substrate Moving Mechanism 53 and Mask Unit Moving Mechanism 55>

As illustrated in FIG. 6, the substrate moving mechanism includes a motor 53a and causes a below-described substrate drive control section 113 to drive the motor 53a so as to move the film formation substrate 200 held by the substrate holder 52.

As illustrated in FIG. 6, the mask unit moving mechanism 55 includes a motor 55a and causes a below-described mask unit drive control section 116 to drive the motor 55a so as to move the mask unit 54 relative to the film formation substrate 200 while maintaining the respective positions (described later) of the mask 60 and the vapor deposition source 70 relative to each other.

The substrate moving mechanism 53 and the mask unit moving mechanism 55 may each be, for example, a roller-type moving mechanism or a hydraulic moving mechanism. The substrate moving mechanism 53 and the mask unit moving mechanism 55 can be, for example, an XYZ stage or the like.

The film formation substrate 200 is preferably movable in any of an X-direction, a Y-direction, and a Z-direction by means of the substrate moving mechanism 53. The mask unit 54 is preferably movable in any of the X-direction, the Y-direction, and the Z-direction by means of the mask unit moving mechanism 55.

The film formation substrate 200 and the mask unit 54 simply need to be so provided that at least one of them is movable relative to the other. In other words, at least one of the substrate moving mechanism 53 and the mask unit moving mechanism 55 needs to be provided.

For example, in a case where the film formation substrate 200 is movable, the mask unit 54 may be fixed to an inner wall of the vacuum chamber 51. By contrast, in a case where the mask unit moving mechanism 55 is movable, the substrate holder 52 may be fixed to an inner wall of the vacuum chamber 51.

<Configuration of Alignment Sensors 56>

The alignment sensors 56 (alignment observing means) each function as position detecting means for use in an alignment between the film formation substrate 200 and the mask 60.

The alignment sensors 56 can each be, for example, an image sensor including a CCD and serving as an image sensing means (image reading means).

FIG. 1 illustrates an example case in which the alignment sensors 56 are provided outside the vacuum chamber 51. The present embodiment, however, is not limited to such an arrangement.

The present embodiment may alternatively be arranged, for example, such that an alignment sensor 56 that is fixed in position relative to the mask 60 is so provided in the vacuum chamber 51 as to be adjacent to the mask 60 and the vapor deposition source 70.

In this case, the alignment sensor 56 simply needs to be fixed in position relative to the mask 60 similarly to vapor deposition source 70, and may be integrated with or independent of the mask unit 54.

The description below deals with an example case in which, as described above, the alignment sensors 56 are each an image sensor including a CCD.

The present embodiment, however, is not limited to such an arrangement. The alignment sensor 56 can be (i) a sensor for detecting the intensity of reflection of, for example, laser light or infrared light or (ii) a sensor for detecting the distribution of light scattered by the alignment markers 202a.

In a case where the alignment sensor 56 is, as described above, a sensor for detecting the intensity of reflection of, for example, laser light or infrared light, the respective positions of the alignment markers 202a can be detected from the intensity of reflection. In the case where the alignment sensor is, as described above, a sensor for detecting the distribution of light scattered by the alignment markers 202a, the respective positions of the alignment markers 202a can be determined from a variation in the distribution of light scattered by the alignment markers 202a.

The alignment sensor 56 is, for example, a sensor, such as (i) a position sensor, (ii) an LED alignment sensor, and (iii) a detector (for example, a half-divided detector or a quadrantly-divided detector), which detects the position of a luminous flux to measure the position of a detection object.

Any of the above sensors can be a commercially available sensor. Among others, an undivided position sensor is capable of measuring the position of a rapidly moving spot with high precision.

The alignment sensor 56 can detect the alignment markers 202a by any of various publicly known systems such as LSA (laser step alignment) system and LIA (laser interferometric alignment) system.

<Configuration of Void Sensors 57>

In order to (i) adjust the gap g1 between the film formation substrate 200 and the mask 60 and (ii) hold the film formation substrate 200 and the mask 60 so that the film formation substrate 200 and the mask 60 are more precisely parallel to each other, the vacuum chamber 51 preferably contains the void sensors 57 as illustrated FIG. 1.

The void sensors 57 each measure the amount of the void between the film formation substrate 200 and the mask 60, and transmit to the control circuit 100 a result of the measurement in the form of a void amount signal.

The void sensors 57 are each, for example, an optical void sensor for measuring (reading) the amount of the void between the film formation substrate 200 and the mask 60 through a transparent film formation substrate 200 or through a transparent region of the film formation substrate 200 (that is, through the film formation substrate 200).

In the above case, the void sensors 57, the film formation substrate 200, and the mask 60 are so attached as to have a positional relationship with which, when measuring the void amount, the void sensors 57 can measure, through a transparent region of the film formation substrate 200, the void extending from the film formation substrate 200 to a non-opening section of the mask 60.

In the present embodiment, the void sensors 57 are each provided at respective positions that (i) are higher than the film formation substrate 200 (that is, on the top surface side thereof) and (ii) correspond to the region of the mask 60 in which region the exposed one-period pattern is formed.

The void sensors 57 are preferably arranged such that a plurality of void sensors 57 are each located at a position that faces an end section of the mask 60 which end section is located upstream in the substrate scanning direction. The void sensors 57 are more preferably arranged such that (i) a plurality of void sensors 57 are each located at a position that faces an end section of the mask 60 which end section is located upstream in the substrate scanning direction and (ii) a plurality of void sensors 57 are each located at a position that faces an end section of the mask 60 which end section is located downstream in the substrate scanning direction.

Providing the void sensors 57 in this manner makes it possible to observe (i) an amount by which the mask 60 is wound off (an amount by which the mask 60 is pulled out of the wind-off roll 91) and (ii) the position of the mask 60, and also to observe the distance between the mask 60 and the film formation substrate 200.

<Configuration of Control Circuit 100>

The control circuit 100 includes a mask position detecting section 101, a computing section 102, the wind-off roll drive control section 103, the wind-up roll drive control section 104, an image detecting section 111, a computing section 112, the substrate drive control section 113, a vapor deposition ON/OFF control section 114, a shutter drive control section 115, the mask unit drive control section 116, a void difference amount computing section 121, a void difference correction amount deriving section 122, and an up-and-down mechanism drive control section 123.

The mask position detecting section 101 detects, on the basis of an image captured by the detectors 95 for use in an absolute alignment of the mask, respective images of (i) the absolute-alignment markers 63 and (ii) the absolute alignment reference markers 58, and detects center coordinates of each of the alignment markers 64 and 65.

The absolute-alignment markers 63 and the absolute alignment reference markers 58 are aligned with each other with use of one of the alignment markers 64 and 65.

The respective relative positions of (i) the position of the mask 60 in the X-axis direction (the center coordinates of an alignment marker out of the alignment markers 64 and 65 which alignment marker serves as an alignment center) and (ii) the absolute alignment reference markers 58 are set in advance.

The computing section 102 calculates, on the basis of the position, detected by the mask position detecting section 101, of the mask 60 in the X-axis direction (the center coordinates of the alignment marker out of the alignment markers 64 and 65 which alignment marker serves as the alignment center), the amount of movement of the mask 60 (a correction value of the position of the mask 60 in the X-direction) so that the relative positions of (i) the position of the mask 60 in the X-axis direction (the center coordinates of the alignment marker out of the alignment markers 64 and 65 which alignment marker serves as the alignment center) and (ii) the absolute alignment reference markers 58 have the set values.

The computing section 102 computes a correction value for a substrate position of the film formation substrate 200 by calculating the amount of positional difference (that is, a rotation component on the X-Y plane) between (i) a parallel line passing through the center coordinates of the respective alignment markers 64 and 65 and (ii) the substrate scanning direction.

The computing section 102 then supplies a result of the calculation, in the form of a correction signal, to the mask unit drive control section 116, the wind-off roll drive control section 103, and the wind-up roll drive control section 104.

The mask unit drive control section 116 drives, on the basis of the correction signal supplied from the computing section 102, the motor 55a, such as an XY θ drive motor, which is provided in the mask unit moving mechanism 55. With this arrangement, the mask unit drive control section 116, while maintaining the respective positions of the mask 60 and the vapor deposition source 70 relative to each other, moves the mask unit 54 (in the X-axis direction in the absolute alignment).

The wind-off roll drive control section 103 and the wind-up roll drive control section 104 rotate the wind-off roll 91 and the wind-up roll 92 respectively, on the basis of the correction signal to thereby correct the above-mentioned position of the mask 60 in the X-direction.

The winding-off/winding-up operation of the mask 60 by means of the wind-off roll 91 and the wind-up roll 92 is carried out by rotating the wind-off roll 91 and the wind-up roll 92 in the same direction so as to (i) wind off the mask 60 from the wind-off roll 91 and (ii), in order to maintain tension of the mask 60 exposed between the wind-off roll 91 and the wind-up roll 92, wind up the mask 60 by means of the wind-up roll 92 by the same length as that of a portion of the mask 60 which portion was wound off.

This arrangement makes it possible to (i) update an exposed one-period pattern of the mask 60 into a new pattern and (ii) carry out an absolute alignment of the mask 60 and an alignment between the film formation substrate 200 and the mask 60.

Rotating the wind-off roll 91 and the wind-up roll 92 in opposite directions, or rotating one of the wind-off roll 91 and the wind-up roll 92 in a state where the other is stopped, makes it possible to adjust tension applied to the mask 60.

For example, tension applied to the mask 60 can be relaxed by (i) rotating the wind-off roll 91 and the wind-up roll 92 in opposite directions so that the mask 60 is wound up by each of the wind-off roll 91 and the wind-up roll 92 or (ii), in a state where one of the wind-off roll 91 and the wind-up roll 92 is stopped, rotating the other so that the mask 60 is wound up by the other.

The present embodiment aligns the mask 60 with an absolute position (that is, a reference position in the device) with use of the absolute-alignment markers 63 and the absolute alignment reference marker 58 as described above. Thus, even in the case where, for example, (i) the vapor deposition device 50 is an inline device, (ii) the substrate moving mechanism 53 is a carrying device including a substrate carrying path, and (iii) the mask 60 and the vapor deposition source 70 extend over the film formation substrate 200, the present embodiment can narrow (limit) a region in which a vapor deposition distribution can be maintained.

The present embodiment can, as described above, (i) align the mask 60 with the absolute position as described above, and thus (ii) accurately fix the respective positions of the vapor deposition device 50 and the mask 60 relative to each other or the respective positions of the vapor deposition source 70 and the mask 60 relative to each other. (There is, however, a minute operating region due to the alignment process as described above.)

The mask 60 needs to be placed within a region (vapor deposition area) in which vapor deposition particles from the vapor deposition source 70 are deposited. Thus, the vapor deposition area needs to be designed to be considerably wide so that no portion of the mask 60 is placed outside the vapor deposition area of the vapor deposition source 70, even if the mask 60 is slightly mispositioned relative to the vapor deposition area of the vapor deposition source 70, in a case where a positional relationship is not correctly fixed between the vapor deposition area of the vapor deposition source 70 and the openings 61 of the mask 60 relative to each other.

In contrast, in the case where the respective positions of the vapor deposition source 70 and the mask 60 relative to each other are accurately fixed (that is, the position of the mask 60 relative to the vapor deposition area of the vapor deposition source 70 is accurately fixed), the vapor deposition area can be narrowed. Thus, the present embodiment (i) eliminates the need for a design that includes a wide vapor deposition area as a precaution so that no problem arises even if the mask 60 is slightly mispositioned, and (ii) allows a vapor deposition material to be efficiently deposited onto the film formation substrate 200. This arrangement consequently improves efficiency of use of the material.

The present embodiment, as described above, includes alignment markers for an absolute alignment in (i) the mask 60 and (ii) a position in either the mask unit 54 or the vacuum chamber 51 which position faces the mask 60. This arrangement makes it possible to correct parallelism (θ adjustment) of the mask 60.

Thus, in the case where the film formation substrate 200 is moved relative to the mask 60, it is possible, even if mispositioning between the film formation substrate 200 and the mask 60 is not corrected by constantly carrying out an alignment during a substrate scan for vapor deposition, to deposit vapor deposition particles onto a target region (stripe-shaped region) by simply carrying out an alignment once with use of the alignment markers 202a of the film formation substrate 200 and the alignment markers 62 of the mask 60 before the panel region 201 of the film formation substrate 200 reaches the openings 61 of the mask 60.

The above arrangement can (i) prevent the vapor-deposited film 211 from having edge blurring caused by θ mispositioning between the substrate scanning direction and the openings 61 of the mask 60, and consequently (ii) more accurately form a predetermined pattern (vapor deposition pattern) of the vapor-deposited film 211.

The image detecting section 111 detects, on the basis of an image captured by the alignment sensors 56, respective images of (i) the alignment markers 202a included in the film formation substrate 200 and (ii) the alignment markers 62 of the mask 60. The image detecting section 111 further detects the start-end and rear-end of the panel region 201 of the film formation substrate 200 on the basis of, among the alignment markers 202a included in the film formation substrate 200, (i) a start-end marker indicative of the start-end of the panel region 201 and (ii) a rear-end marker indicative of the rear-end of the panel region 201.

The start-end marker and the rear-end marker mentioned above may be identical to each other. In this case, the image detecting section 111 detects, with respect to the substrate scanning direction, whether a particular end of the panel region 201 is its start-end or rear-end.

The computing section 112 determines, from the image detected by the image detecting section 111, the amount of movement of the film formation substrate 200 and the mask 60 relative to each other (for example, the amount of movement of the film formation substrate 200 relative to the mask 60).

Specifically, the computing section 112 calculates, from the image detected by the image detecting section 111, (i) the amount of alignment correction (that is, the value of correction to the substrate position of the film formation substrate 200) and (ii) the amount of correction of the substrate scan. The computing section 112 then supplies a result of the calculation, in the form of a correction signal, to the substrate drive control section 113, the mask unit drive control section 116, the wind-off roll drive control section 103, and the wind-up roll drive control section 104.

The amount of alignment correction is determined by computation with respect to the direction perpendicular to the substrate scanning direction and a rotation direction of the film formation substrate 200.

The rotation direction of the film formation substrate refers to a direction of rotation on the X-Y plane about a Z-axis, as a rotation axis, at the center of the film formation surface of the film formation substrate 200.

That is, the computing section 112 measures the amount of positional difference (that is, a shift component along the X-axis direction and the Y-axis direction, and a rotation component on the X-Y plane) between the alignment markers 202a and the alignment markers 62 to compute a correction value for the substrate position of the film formation substrate 200.

The substrate drive control section 113 and the mask unit drive control section 116, on the basis of the correction signal from the computing section 112, move at least a first one of the film formation substrate 200 and the mask unit 54 relative to a second one thereof so that the film formation substrate 200 and the mask unit 54 are each moved to a suitable scanning position.

The substrate drive control section 113 drives, on the basis of the correction signal from the computing section 112, a motor 52a such as an XY θ drive motor, that is included in the substrate moving mechanism 53. With this arrangement, the substrate drive control section 113 moves the film formation substrate 200 to correct the substrate position of the film formation substrate 200.

The mask unit drive control section 116 drives, on the basis of the correction single from the computing section 112, the motor 55a, such as an XY θ drive motor, that is included in the mask unit moving mechanism 55. With this arrangement, the mask unit drive control section 116, while maintaining the respective positions of the mask 60 and the vapor deposition source 70 relative to each other, moves the mask unit 54 relative to film formation substrate 200.

The wind-off roll drive control section 103 and the wind-up roll drive control section 104 adjust tension to the mask 60 so that the mask 60 is at an appropriate vapor deposition position.

In a case where, as described above, (i) a one-period pattern contains the absolute-alignment markers 63, (ii) the mask unit 54 is fixed after an absolute alignment of the mask 60 is carried out in advance with use of the absolute-alignment markers 63 and the absolute alignment reference markers 58, and (iii) the film formation substrate 200 is moved relative to the mask unit 54, it is possible to carry out an alignment between the film formation substrate 200 and the mask unit 54 by moving the film formation substrate 200 to a suitable scanning position.

The present embodiment deals with an example case in which the alignment sensors 56 are image sensors. However, as described above, the amount of misalignment can be also determined from, for example, the intensity of reflection of laser light.

The vapor deposition ON/OFF control section 114 (i) generates a vapor deposition OFF signal when the image detecting section 111 has detected the rear-end of the panel region 201, and (ii) generates a vapor deposition ON signal when the image detecting section 111 detects the start-end of the panel region 201.

In a case where, as described above, the alignment sensors 56 are sensors other than image sensors, the vapor deposition ON/OFF control section 114 may (i) calculate, from the amount of substrate scan and the amount of correction of substrate scan which have been calculated on the basis of a result of the detection carried out by the alignment sensors 56, the position of the film formation substrate 200 relative to the vapor deposition area of the vapor deposition source 70, (ii) generate a vapor deposition ON signal at the start-end of the panel region 201, and (iii) generate a vapor deposition OFF signal at the rear-end of the panel region 201.

The shutter drive control section 115 (i) closes the shutter 96 upon receipt of a vapor deposition OFF signal from the vapor deposition ON/OFF control section 114 and (ii) opens the shutter 96 upon receipt of a vapor deposition ON signal from the vapor deposition ON/OFF control section 114.

In a case where, as described above, (i) a one-period pattern contains the absolute-alignment markers 63, (ii) the mask unit 54 is fixed after an absolute alignment of the mask is carried out in advance with use of the absolute-alignment markers 63 and the absolute alignment reference markers 58, and (iii) the film formation substrate 200 is moved relative to the mask 60, the ON/OFF control for vapor deposition can be carried out, even without recognition of the alignment markers 202a of the film formation substrate 200, on the basis of the distance (absolute distance for substrate movement) from the film formation substrate 200 to the alignment markers for an absolute alignment along the scanning direction for the film formation substrate 200, since the absolute position of the mask 60 inside the vacuum chamber 51 or the position of the mask 60 relative to the vapor deposition source 70 has been fixed.

The void difference amount computing section 121 calculates, from the void amount signal transmitted from the void sensor 57, the amount of difference (void difference amount) between (i) the gap between the film formation substrate 200 and the mask 60, the gap having been measured by the void sensor 57, and (ii) the gap g1, in the Z-direction, between the film formation substrate 200 and the mask 60, the gap g1 having been set in advance.

The void difference correction amount deriving section 122 derives, from the void difference amount calculated by the void difference amount computing section 121, a correction value (void correction value) for correcting the above difference, and transmits a result of the derivation to the up-and-down mechanism drive control section 123 in the form of an adjustment signal.

The up-and-down mechanism drive control section 123, on the basis of the adjustment signal (void correction value), moves the up-and-down mechanism 81 along the Z-axis direction to control the gap (mask gap) between the film formation substrate 200 and the mask 60 so that the gap is uniform.

In a case where the up-and-down mechanism 81 is moved along the Z-axis direction, tension applied to the mask 60 changes. This causes mispositioning.

According to the present embodiment, however, the mispositioning caused by the change in tension is detected by the detectors 95 or the alignment sensors 56 and canceled out by tension adjustment with use of the wind-off roll 91 and the wind-up roll 92.

<Overall Configuration of Organic EL Display Device>

Next, the following description describes, as an example vapor deposition method involving the vapor deposition device 50, a method for producing an organic EL display device that (i) is of a bottom emission type, that is, extracts light from a TFT substrate side, and that (ii) carries out an RGB full color display.

The description first deals with the overall configuration of the organic EL display device.

Figure 7:
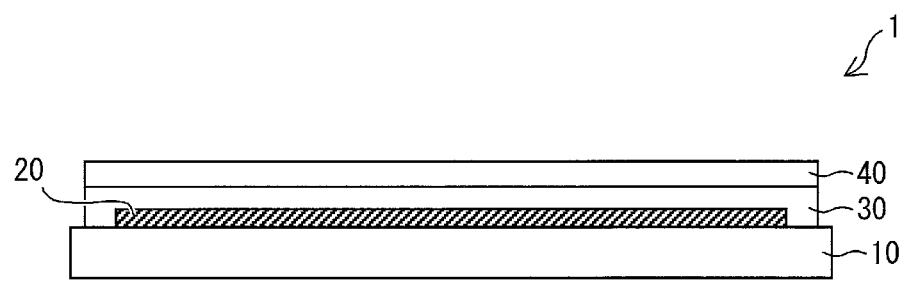
FIG. 7 is a cross-sectional view schematically illustrating a configuration of an organic EL display device that carries out an RGB full color display.
Figure 8:
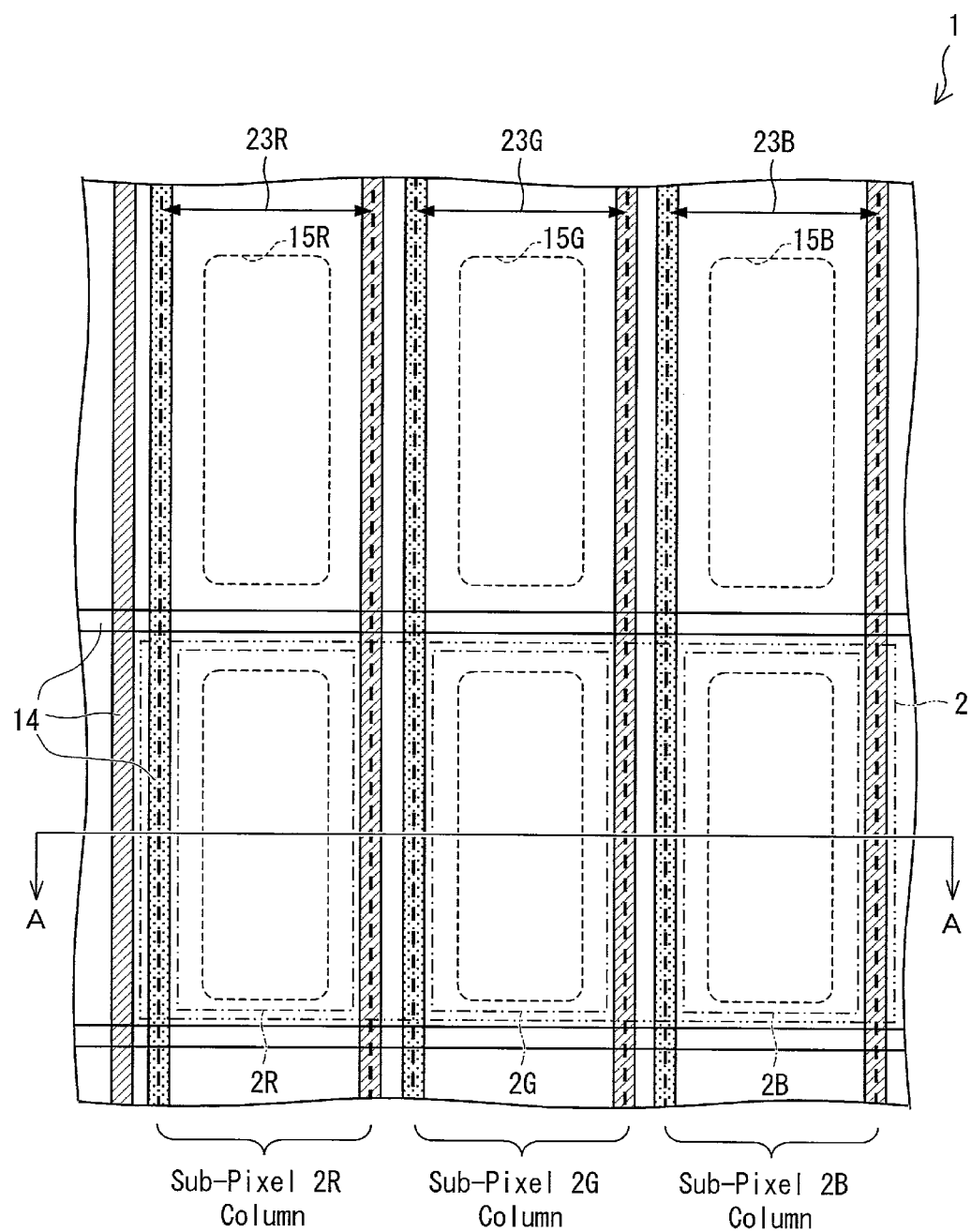
FIG. 8 is a plan view illustrating an arrangement of pixels included in the organic EL display device illustrated in FIG. 7.
Figure 9:
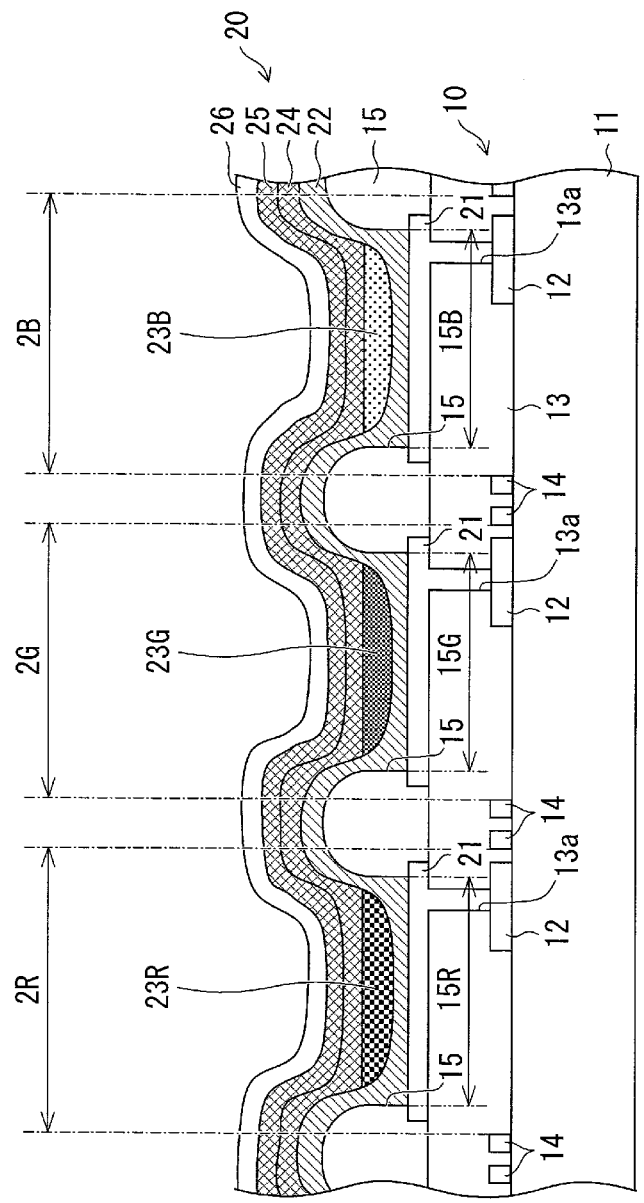
FIG. 9 is a cross-sectional view, taken along a line A-A, of a TFT substrate included in the organic EL display device illustrated in FIG. 8.

FIG. 7 is a cross-sectional view schematically illustrating a configuration of the organic EL display device that carries out an RGB full color display. FIG. 8 is a plan view illustrating an arrangement of pixels included in the organic EL display device illustrated in FIG. 7. FIG. 9 is a cross-sectional view, taken along the line A-A, of a TFT substrate included in the organic EL display device illustrated in FIG. 8.

As illustrated in FIG. 7, the organic EL display device 1 produced in the present embodiment includes: a TFT substrate 10 including TFTs 12 (see FIG. 9); organic EL elements 20 provided on the TFT substrate 10 and connected to the TFTs 12; an adhesive layer 30; and a sealing substrate 40, arranged in that order.

As illustrated in FIG. 7, the organic EL elements 20 are contained between the TFT substrate 10 and the sealing substrate 40 by attaching the TFT substrate 10, on which the organic EL elements 20 are provided, to the sealing substrate 40 with use of the adhesive layer 30.

Since the organic EL display device 1 has this arrangement in which the organic EL elements 20 are contained between the TFT substrate 10 and the sealing substrate 40, infiltration of oxygen, moisture and the like present outside into the organic EL elements 20 is prevented.

As illustrated in FIG. 9, the TFT substrate 10 includes, as a supporting substrate, a transparent insulating substrate 11 such as a glass substrate. The insulating substrate 11 is, as illustrated in FIG. 8, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region of R, G, or B for such a single sub-pixel.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions of the respective colors which luminescent regions perform light emission of the respective sub-pixels 2R, 2G, and 2B, openings 15R, 15G, and 15B that are covered respectively by stripe-shaped luminescent layers 23R, 23G, and 23B of the respective colors.

The luminescent layers 23R, 23G, and 23B are each formed in a pattern and color by vapor deposition. The openings 15R, 15G, and 15B are described below in detail.

The sub-pixels 2R, 2G, and 2B include respective TFTs 12 each connected to a first electrode 21 of a corresponding one of the organic EL elements 20. The sub-pixels 2R, 2G, and 2B each have an emission intensity that is determined by scan through the wires 14 and selection of the TFTs 12. As described above, the organic EL display device 1 carries out an image display by selectively causing the organic EL elements 20 to emit, by use of the TFTs 12, light with desired luminance.

The following describes in detail respective configurations of the TFT substrate 10 and each of the organic EL elements 20 both included in the organic EL display device 1.

<Configuration of TFT Substrate 10>

The description below first deals with the TFT substrate 10.

The TFT substrate 10, as illustrated in FIG. 9, includes on a transparent insulating substrate 11 such as a glass substrate: TFTs 12 (switching elements) and wires 14; an interlayer film 13 (interlayer insulating film; planarizing film); and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well-known, the individual layers of a TFT 12 are not illustrated in the drawings or described herein.

The interlayer film 13 is provided on the insulating substrate 11 throughout the entire region of the insulating substrate 11 to cover the TFTs 12 and the wires 14.

There are provided on the interlayer film 13 first electrodes 21 of the organic EL elements 20.

The interlayer film 13 has contact holes 13a for electrically connecting the first electrodes 21 of the organic EL elements 20 to the TFTs 12. This electrically connects the TFTs 12 to the organic EL elements 20 via the contact holes 13a.

The edge cover 15 is an insulating layer for preventing the first electrode 21 and a second electrode 26 of a corresponding one of the organic EL elements 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

<Configuration of Organic EL Element 20>

The description below now deals with each of the organic EL elements 20.

The organic EL element 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to the TFTs 12 via the contact holes 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrode 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the luminescent layers 23R, 23G, and 23B.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL element 20 can have, for example, any of the layered structures (1) through (8) below.

(1) first electrode/luminescent layer/second electrode (2) first electrode/hole transfer layer/luminescent layer/electron transfer layer/second electrode (3) first electrode/hole transfer layer/luminescent layer/hole blocking layer (carrier blocking layer)/electron transfer layer/second electrode (4) first electrode/hole transfer layer/luminescent layer/hole blocking layer/electron transfer layer/electron injection layer/second electrode (5) first electrode/hole injection layer/hole transfer layer/luminescent layer/electron transfer layer/electron injection layer/second electrode (6) first electrode/hole injection layer/hole transfer layer/luminescent layer/hole blocking layer/electron transfer layer/second electrode (7) first electrode/hole injection layer/hole transfer layer/luminescent layer/hole blocking layer/electron transfer layer/electron injection layer/second electrode (8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

<Method for Producing Organic EL Display Device>

The description below deals with a method for producing the organic EL display device 1.

Figure 10:
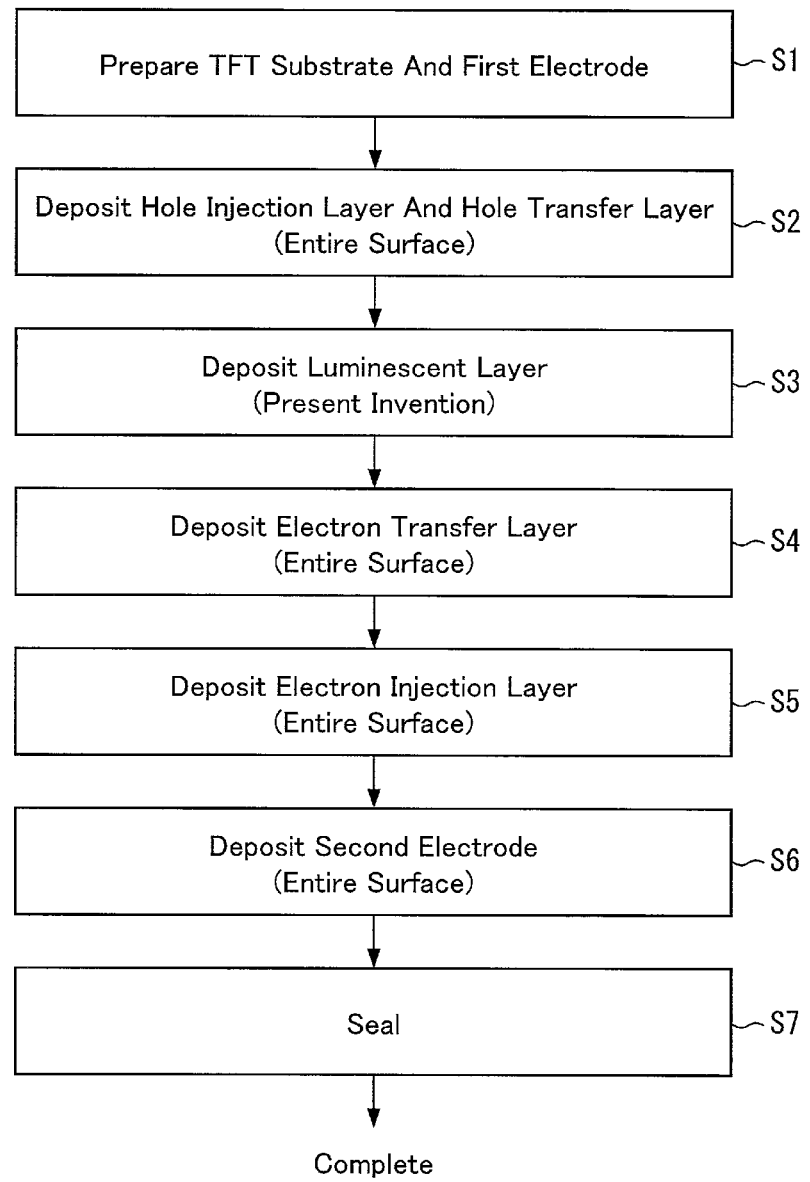
FIG. 10 is a flowchart illustrating an example of successive steps for producing the organic EL display device illustrated in FIG. 7.

FIG. 10 is a flowchart illustrating an example of successive steps for producing the organic EL display device 1.

As illustrated in FIG. 10, the method of the present embodiment for producing the organic EL display device 1 includes steps such as a TFT substrate/first electrode preparing step (S1), a hole injection layer/hole transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 10, the individual steps described above with reference to FIGS. 7 and 9.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 9, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (long-side length) of 400 to 500 mm along a Y-axis direction, and (iii) a length (short-side length) of 300 to 400 mm along an X-axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 9.

The interlayer film 13 is simply required to have a film thickness that can compensate for the difference in level created by the TFTs 12. The film thickness is thus not particularly limited. The film thickness was, for example, approximately 2 µm in the present embodiment.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, as with the interlayer film 13, to have a film thickness of, for example, approximately 1 µm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of a chain conjugated or heterocyclic conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl(α-NPD) and that had a film thickness of 30 nm.

The method of the present embodiment next carries out a selective application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S3).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis(benzohydroxyquinolinate) beryllium complex, (iv) a tri (dibenzoylmethyl) phenanthroline europium complex, (v) and ditoluyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a selective application formation (pattern formation) of such luminescent layers 23R, 23G, and 23B.

A description below deals in detail with a selective application formation of the luminescent layers 23R, 23G, and 23B which selective application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as a tris(8-hydroxyquinolinate) aluminum complex, an oxadiazole derivative, a triazole derivative, a phenylquinoxaline derivative, and a silole derivative.

Specific examples of the material include (i) Alq(tris(8-hydroxy quinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, organic EL elements 20 each including the organic EL layer, the first electrode 21, and the second electrode 26 described above.

The method of the present embodiment then attached (i) the TFT substrate 10, on which the organic EL elements 20 is provided, to (ii) a sealing substrate 40 with use of an adhesive layer 30 as illustrated in FIG. 7 so that the organic EL elements 20 were contained.

The sealing substrate 40 is, for example, an insulating substrate such as a glass substrate and a plastic substrate and 0.4 to 1.1 mm in thickness. The sealing substrate 40 of the present embodiment was a glass substrate.

The long-side and short-side lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL elements 20 contained therebetween is divided in accordance with the size of a target organic EL display device 1.

The method for containing the organic EL elements 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL elements 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1, upon receipt of a signal through a wire 14, turns on a TFT 12 and thus allows (i) holes (positive holes) to be injected from the first electrode 21 into the organic EL layer and further (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

<Method of Forming Pattern of Organic EL Layer>

Next, the following will detail a method of forming a pattern of an organic EL layer as the vapor-deposited film 211, with use of the vapor deposition device 50 according to the present embodiment as a device for producing the organic EL display device 1.

Note that the following description will deal with, as an example, a case of (i) using, as the film formation substrate 200, the TFT substrate 10 obtained at the completion of the hole injection layer/hole transfer layer vapor deposition step (S2) and (ii) carrying out selective application formation of the luminescent layers 23R, 23G, and 23B, as pattern formation of an organic EL layer, in the luminescent layer vapor deposition step (S3).

Note that in a case where selective application formation of the luminescent layers 23R, 23G, and 23B with respect to the TFT substrate 10 is carried out as pattern formation of the vapor-deposited film 211 on the film formation substrate 200, the openings 61 of the mask 60 are formed in correspondence with the size and pitch of columns for each color of the luminescent layers 23R, 23G, and 23B.

Figure 11:
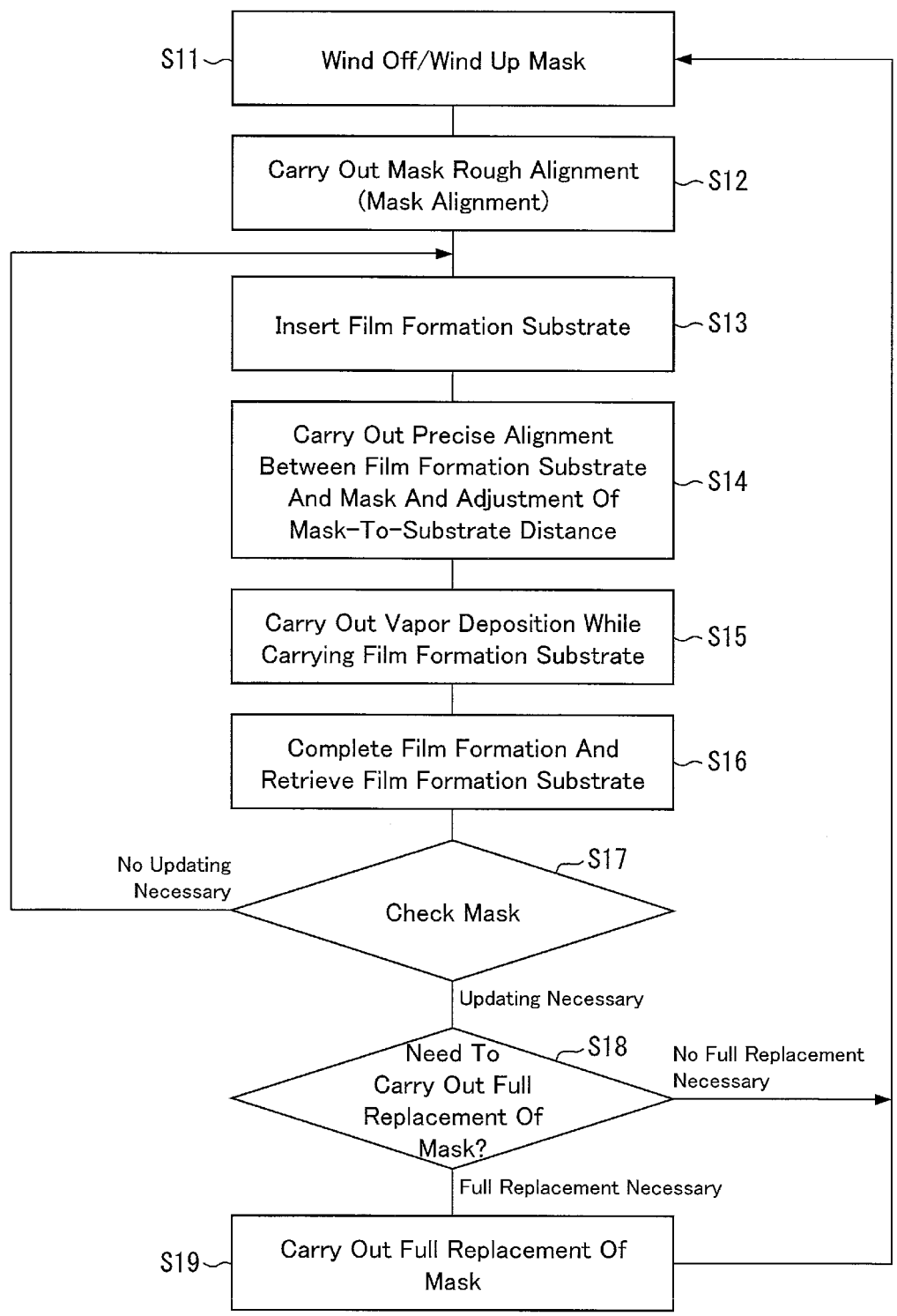
FIG. 11 is a flowchart illustrating an example of a method for forming a film of a predetermined pattern on a film formation substrate with use of a vapor deposition device in accordance with Embodiment 1 of the present invention.

FIG. 11 is a flowchart illustrating an example of a method for forming a film of a predetermined pattern on the film formation substrate 200 with use of the vapor deposition device 50 in accordance with the present embodiment.

In accordance with the flow of the procedure illustrated in FIG. 11, the following will specifically describe a method for forming the luminescent layers 23R, 23G, and 23B illustrated in FIG. 9 with use of the vapor deposition device 50.

Note that the following description assumes that the procedure starts after full replacement of the mask 60 is done.

First, as illustrated in FIG. 1, with use of the mask-to-substrate distance adjusting members 80, the mask 60 is placed on the vapor deposition source 70 provided in the vacuum chamber 51. Then, the wind-off roll 91 and the wind-up roll 92 are rotated so that one (1) period pattern of the mask 60 is exposed.

At this time, winding-off/winding-up of the mask 60 is carried out until the one-period pattern thus exposed is positioned between the mask-to-substrate distance adjusting members 80, which are so provided, on opposite sides of a substrate carrying path, as to face each other (S11).

Note that the above alignment is finally carried out in the following rough alignment step.

Subsequently, the rough alignment is carried out, as described above, to fix a position of the mask 60 relative to the vapor deposition device and positions of the mask 60 and the vapor deposition source 70 relative to each other (however, this does not apply to movement carried out by fine adjustment for the alignment between the film formation substrate 200 and the mask 60) (S12).

At this time, as described above, in the case where selective application formation of the luminescent layers 23R, 23G, and 23B is carried out as pattern formation of the organic EL layer, rough alignment is carried out so that each sub-pixel column of an identical color of the TFT substrate 10, which is the film formation substrate 200, has a direction that is identical to the scanning direction.

The rough alignment is carried out with use of the absolute-alignment markers 63 by carrying out the winding-off/winding-up operation and the tension application operation by means of the wind-off roll 91 and the wind-up roll 92, using the absolute alignment reference markers 58 as a guide, so as to determine an absolute position of the mask 60, i.e. the position of the mask 60 relative to the vapor deposition device.

For example, in a case where an actually measured distance between the absolute-alignment marker 63 and the absolute alignment reference marker 58 is less than a preset value, agreement of the actually measured distance to the preset value is carried out by stretching the mask 60 by tension applied to the mask 60 by rotation of the wind-off roll 91 and the wind-up roll 92.

This allows the positions of the mask 60 and the vapor deposition source 70, the vapor deposition device, and other units relative to each other to be constantly fixed. Note that a position detection method for the rough alignment may be, as a matter of course, replaced by any other method.

According to the present embodiment, the rotation of the wind-off roll 91 and the wind-up roll 92 as described above applies tension to the mask 60 with use of each of the mask-to-substrate distance adjusting members 80 as a fulcrum. This makes it possible to carry out mask alignment as described above and also to eliminate curling of the mask 60 unwound while simultaneously carrying out mask alignment.

Consequently, it is possible to stretch straight the exposed portion of the mask 60 which portion lies between the opposed mask-to-substrate distance adjusting members 80.

Note that how to check a direction parallel to the substrate scanning direction with use of the absolute-alignment markers 63 and how to carry out absolute alignment of the mask 60 with use of the absolute-alignment markers 63 will be detailed later.

Note that the rough alignment is carried out for each full replacement of the mask 60 or for each updating of the mask 60, as illustrated in FIG. 11.

Subsequently, the TFT substrate 10 serving as the film formation substrate 200 is inserted in the vacuum chamber 51 (S13), and a precise alignment between the film formation substrate 200 and the mask 60 is then carried out (S14).

Further, in the step S14, it is preferable that alignment in the Z direction is carried out not only by carrying out the precise alignment between the film formation substrate 200 and the mask 60 in their plane directions (i.e. XYθ directions) but also by adjusting a distance between the mask 60 and the film formation substrate 200.

The precise alignment between the film formation substrate 200 and the mask 60 can be realized by moving the entire mask unit 54 or the film formation substrate 200. Alternatively, the precise alignment between the film formation substrate 200 and the mask 60 can also be realized by carrying out the winding-off/winding-up operation of the wind-off roll 91 and the wind-up roll 92.

Further, the tension applied to the mask 60 may be controlled by wind-up torque developed by the wind-off roll 91 and the wind-up roll 92, so that positions of the respective openings 61 of the mask 60 can be finely adjusted.

In a case where the film formation substrate 200 is moved relative to the mask unit 54 to carry out vapor deposition, the alignment between the film formation substrate 200 and the mask 60 is carried out as follows. For example, the film formation substrate 200 is moved relative to the mask unit 54, and traveling (scanning) of the film formation substrate 200 is temporarily stopped at a time when the alignment marker section 202 of the film formation substrate 200 illustrated in FIG. 1 reaches regions (alignment marker section) where the alignment markers 62 are formed in the mask 60.

Subsequently, in consideration of the respective positions of the mask 60 and the film formation substrate 200, parallelism of the film formation substrate 200, and the size of the mask 60, the movement of the film formation substrate 200 and/or the above-described rotation of the wind-off roll 91 and the wind-up roll 92 are/is carried out.

Note here that preparing in advance the mask 60 with a small size, and applying tension to the mask 60 by means of the wind-off roll 91 and the wind-up roll 92 allows prevention of bending of the mask 60.

A distance between the mask 60 and the film formation substrate 200 can be adjusted with use of the mask-to-substrate distance adjusting members 80.

The mask-to-substrate distance adjusting members 80 are given a role in keeping parallelism between the mask 60 and the film formation substrate 200 and in holding the mask 60.

In the present embodiment, the tension adjustment is carried out by torque adjustment using the wind-off roll 91 and the wind-up roll 92 as described earlier, and adjustment of a height direction of the mask-to-substrate distance adjusting members 80 is used only for adjustment of the distance between the film formation substrate 200 and the mask 60.

Note here that, as described earlier, a distance (void amount) between the mask 60 and the film formation substrate 200 is measured with use of the void sensors 57, and the void amount is finely adjusted with use of up-and-down mechanisms 81. This makes it possible to more precisely control the distance between the mask 60 and the film formation substrate 200.

Further, in this case, a plurality of up-and-down mechanisms 81 are provided, as described earlier. This makes it possible to locally control the void amount in accordance with distribution of the void amount.

In the present embodiment, a gap g2 between the vapor deposition source 70 and the mask 60 is 100 mm, while a gap g1 between the TFT substrate 10, which serves as the film formation substrate 200, and the mask 60 is 200 μm.

Subsequently, vapor deposition is carried out while at least a first one of the film formation substrate 200 and the mask unit 54 is moved relative to a second one, so that a predetermined film formation pattern is formed at a designated position of the panel region 201 of the film formation substrate 200 (S14).

In the present embodiment, by carrying out vapor deposition while carrying (scanning) the film formation substrate 200, a striped film formation pattern is formed on the panel region 201 of the film formation substrate 200.

At this time, a precise alignment may be carried out while carrying the film formation substrate 200, and adjustment (gap control) of the distance between the mask 60 and the film formation substrate 200 may be carried out. Further, for control of film formation, a rate for substrate carriage may be changed, or the film formation may be suspended.

Substrate scanning is carried out at a preset vapor deposition rate which allows passage of the film formation substrate 200 over the mask 60.

In the present embodiment, first, vapor deposition of materials for the red luminescent layer 23R with respect to the TFT substrate 10 is carried out while the TFT substrate 10 serving as the film formation substrate 200 is scanned at 30 mm/s so that the TFT substrate 10 passes over the mask 60.

At this time, (i) a precise alignment with use of the alignment markers 62 and 202a is carried out, simultaneously with scanning, so that the openings 61 of the mask 60 coincide with red sub-pixel 2R columns, and (ii) adjustment of the distance between the mask 60 and the film formation substrate 200 is carried out, simultaneously with scanning, with use of the void sensors 57 and the up-and-down mechanisms 81. Consequently, during the scanning, the distance between the mask 60 and the film formation substrate 200 (gap g1, substrate-to-mask gap) is held constant.

Adjustment of the distance between the mask 60 and the film formation substrate 200 by slightly raising and/or lowering the mask-to-substrate distance adjusting members 80 causes the tension applied to the mask 60 to be slightly varied. In this case as well, such variation can be cancelled out by control of the rotations of the wind-off roll 91 and the wind-up roll 92 with use of the wind-off roll drive control section 103 and the wind-up roll drive control section 104.

Vapor deposition particles of the red organic materials which particles are emitted from the vapor deposition source 70 are deposited, through the openings 61 of the mask 60, onto the mask 60 at positions facing the respective openings 61 of the mask 60, when the TFT substrate 10 passes over the mask 60.

The film thickness of the luminescent layer 23R can be adjusted on the basis of (i) a reciprocating scan (that is, reciprocation of the TFT substrate 10) and (ii) a scan speed. For example, after vapor deposition is carried out by scanning the TFT substrate 10 in one direction, the TFT substrate 10 is scanned in a reverse direction so that the red organic materials are further deposited, in the same manner as above, at the positions where the red organic materials are to be deposited. In this way, the film thickness of the luminescent layer 23R can be adjusted.

In a case where the non-vapor deposition region of the TFT substrate 10 is positioned directly above the openings 61 of the mask 60, insertion of the shutter 96 between the vapor deposition source 70 and the mask 60 can prevent vapor deposition particles from depositing onto the non-vapor deposition region.

If necessary, a masking film may be adhered to the non-vapor deposition region (a portion that needs no vapor deposition, such as a terminals provided around the panel region 201, and the like portion) of the TFT substrate 10 so as to cover the non-vapor deposition region.

Thereafter, the film formation is completed, and the film formation substrate 200 is retrieved from the vacuum chamber 51 (S16).

The film formation substrate 200 having been retrieved from the vacuum chamber 51, i.e. the TFT substrate 10 on which the luminescent layer 23R has been formed, is then subjected to formation of a green luminescent layer 23G, with use of a mask unit 54 and a vacuum chamber 51 both intended for green luminescent layer 23G formation, in a manner similar to the process of forming the luminescent layer 23R.

After the luminescent layer 23G has been thus formed, a blue luminescent layer 23B is formed, with use of a mask unit and a vacuum chamber 51 both intended for blue luminescent layer 23B formation, in a manner similar to the respective processes of forming the luminescent layers 23R and 23G.

Specifically, for each of the processes of forming the luminescent layers 23G and 23B, a mask 60 having openings at positions for a corresponding one of the luminescent layers 23G and 23B is prepared. Each mask 60 is placed in a vacuum chamber 51 intended for forming a corresponding one of the luminescent layers 23G and 23B, alignment is carried out so that the openings 61 of the mask 60 coincide with a corresponding one of (i) sub-pixel 2G columns and (ii) sub-pixel 2B columns, and the TFT substrate 10 is then scanned for vapor deposition.

With the above steps, it is possible to obtain a TFT substrate 10 on which respective patterns of the luminescent layers 23R, 23G, and 23B having respective colors of red (R), green (G), and blue (B) are formed.

As described above, according to the present embodiment, first of all, the alignment between the film formation substrate 200 and the mask 60 is carried out with use of, as a guide, (i) the absolute-alignment markers 63 and absolute alignment reference markers 58, which serve as markers for absolute alignment of a mask, and (ii) alignment markers 62 and 202a, which are markers for alignment, and the like. Thereafter, vapor deposition particles are caused to emit from the vapor deposition source 70, and, in such a state, scanning of the film formation substrate 200 is then carried out. This makes it possible to obtain a desired striped pattern.

Subsequently, checking of whether or not the mask 60 has met a predetermined vapor deposition criterion is carried out for checking of whether or not the mask 60 needs to be updated (S17).

Note here that "updating of the mask 60" means exposure of a subsequent one-period pattern (a subsequent group of opening pattern) by winding-off/winding-up of the mask 60.

A criterion for updating of the mask 60 (update timing) can be established as desired. Taken as an example is a method in which a counter (not shown), which is provided in the vapor deposition device 50, counts the number of times film formation has been carried out, and the mask 60 is updated when the number of times film formation has been carried out reaches a specified number of times.

Apart from the specified number of times film formation has been carried out as described above, the criterion for updating of the mask 60 (a predetermined criterion for updating) can be, for example, (i) a cumulative film thickness of the vapor-deposited film 211 or (ii) a film thickness of a vapor-deposited object 212 (see (*a*) and (*b*) of FIG. 17) built up on an exposed region of the mask 60 where a one-period pattern is formed.

This approach may be realized by providing a film thickness sensor (not shown) in the vapor deposition device 50 and by employing a method in which the mask 60 is updated when a film thickness of the vapor-deposited object 212 built up on the exposed region of the mask 60 where a one-period pattern is formed reaches a preset film thickness, as illustrated in (*a*) and (*b*) of FIG. 17.

Alternatively, another method may be employed in which a film thickness sensor (not shown), which is provided in the vapor deposition device 50, measures a film thickness of the vapor-deposited film 211 actually deposited onto the film formation substrate 200 and thus controls a film thickness of the vapor-deposited film 211 to be formed on the film formation substrate 200, while calculating a cumulative film thickness of the vapor-deposited film 211 from the film thickness thus measured, so that the mask 60 is updated when the cumulative film thickness thus calculated reaches a preset film thickness.

The film thickness sensor can be, for example, a commercially available film thickness sensor, and can thus be any film thickness sensor. The film thickness sensor suitably uses, for example, a non-contact technique of calculating a film thickness by (i) emitting laser light to the vapor-deposited film 211 serving as an object and (ii) detecting, for example, the intensity of reflection of the laser light or the spectrum of reflected light. The film thickness sensor is, however, not limited to such an arrangement. The film thickness sensor may thus use a technique involving fluorescence based on ultraviolet light or X-rays, or may be a film thickness sensor of an eddy current type or a contact type.

In S17, if there is no need to update the mask 60, the process returns to S13 to continue insertion of the film formation substrate 200 in the vacuum chamber 51 and precise alignment between the film formation substrate 200 and the mask 60.

On the other hand, in S17, if the mask 60 needs to be updated, checking of whether or not there is need to carry out full replacement of the mask 60 is further carried out (S18).

Full replacement of the mask 60 is carried out when the vapor-deposited object 212 (see (*a*) and (*b*) of FIG. 17) is adhered on all mask regions, i.e. all pattern-formed regions (regions where groups of opening pattern are formed) of the mask 60, and the vapor deposition device 50 runs out of a fresh mask region (a pattern-formed region to be wound off).

In S18, if there is no need to carry out full replacement of the mask 60, the process returns to S11 to carry out winding-off/winding-up of the mask 60 and thus carry out exposure of a subsequent one-period pattern (updating of the mask 60).

This makes it possible to use a mask free of a flaw as indicated in (*b*) of FIG. 17, that is, to use new openings 61 all the times, for vapor deposition with respect to the film formation substrate 200.

Further, the above updating operation can be carried out under vacuum in an extremely simple manner and in a short time since the updating operation only requires winding-off/winding-up of the mask 60.

As a matter of course, updating of the mask 60 is desirably carried out in a condition (period of time) where delivery of the film formation substrate 200 above the mask 60 is not carried out, i.e. during a period of time in which film formation is not carried out, such as a period of time between the completion of a preceding film formation substrate 200 and the start of delivery of a subsequent film formation substrate 200.

This makes it possible to carry out mask updating without hindering the film formation operation.

On the other hand, in S18, if it is determined that there is need to carry out full replacement of the mask 60, full replacement of the mask 60 is carried out by retrieving the mask 60 from the vacuum chamber 51 and then inserting a new mask 60 inside the vacuum chamber 51 (S19). Thereafter, the process returns to S11 to repeat the steps described previously.

In this case, the used mask 60, which is formed into a roll form, is very easy to replace.

Next, the following will describe (i) how to check the direction parallel to the substrate scanning direction with use of the absolute-alignment markers 63 and (ii) how to carry out absolute alignment of the mask 60 with use of the absolute-alignment markers 63.

<Checking of Direction Parallel to the Substrate Scanning Direction with Use of the Alignment Markers 64 and 65>

First of all, the method first detects center coordinates of each of the alignment markers 64 and 65 with use of detectors 95 for absolute alignment of a mask. The detector 95 to read the center coordinates of each of the alignment markers 64 and 65 can be, for example, an image sensor including a CCD and serving as image sensing means (image reading means).

The method then adjusts the position of the mask 60 by moving the mask unit 54 so that a parallel line passing through the center coordinates is parallel to the substrate scanning direction.

This allows the substrate scanning direction to be parallel to opening ends (i.e. long sides 61*b*) of the openings 61 formed in the mask 60 for vapor deposition which ends are parallel to the substrate scanning direction.

The number of absolute-alignment markers 63 (alignment markers 64 and 65) to be provided in a one-period pattern may be one. However, it is more preferable that two absolute-alignment markers 63 are provided so as to sandwich the openings 61 therebetween, as illustrated in FIGS. 1, 3, and 4.

In the case where the substrate scanning direction is made parallel, with use of the absolute-alignment markers 63 provided at both sides of a group of the openings 61, to the sides of the mask 60 which sides need to be parallel to the substrate scanning direction, it is possible to more accurately carry out correction of parallelism (θ adjustment) of the mask 60.

The above description has discussed a method of carrying out correction of parallelism (θ adjustment) of the mask 60 with use of a plurality of alignment markers as the absolute-alignment markers 63 as described above. The present embodiment is, however, not limited to such an arrangement.

For example, in the case where the absolute-alignment marker 63 is adjusted precisely so that (i) the rotation midpoint of the absolute alignment reference marker 58 coincides, at an identical point (at identical coordinates), with (ii) the midpoint (center coordinates) of the absolute-alignment marker out of the absolute-alignment markers 63 which absolute-alignment marker serves as an alignment center, the absolute-alignment markers 63 do not necessarily need to include a plurality of alignment markers. Alternatively, a single absolute-alignment marker 63 may be provided in a one-period pattern.

<Absolute Alignment of the Mask 60>

The absolute-alignment markers 63 and the absolute alignment reference markers 58 are aligned with each other with use of one of the alignment markers 64 and 65.

Specifically, the respective relative positions of (i) the absolute alignment reference marker 58 and (ii) an alignment marker out of the alignment markers 64 and 65 which alignment marker serves as an alignment center are set in advance, and the position of the mask 60 is adjusted to achieve the set value.

In the above regard, the mask 60 is preferably provided with a large aperture so that the absolute alignment reference marker 58 can be seen easily.

Such a large aperture may, however, be deformed when tension is applied to the mask 60.

Thus, the present embodiment is preferably arranged such that (i) in addition to the opening 66 serving as a window through which to see the mask 60, alignment markers 64 and 65 are provided which are smaller than the opening 66 and which are unlikely distorted and (ii) the alignment markers 64 and 65 are thus used respectively as an alignment marker serving as an alignment center and an alignment marker for checking parallelism, so that the mask 60 is adjusted to its absolute position.

The opening 66 may be a single aperture (hole) or a mesh-pattern aperture. In the case where the opening 66 serving as a window as described above is not a single hole but a latticed window (mesh-pattern aperture) that is open to such an extent as to allow the absolute alignment reference marker 58 to be seen, distortion of the window can be prevented.

As described above, the present embodiment provides (i) the absolute-alignment markers 63 to the mask 60 and (ii) the absolute alignment reference markers 58 to positions in the vapor deposition device 50 which positions face the mask 60. The present embodiment further adjusts the respective positions of an absolute-alignment marker 63 and the absolute alignment reference marker 58 relative to each other. This allows the mask 60 to be placed at the absolute position inside the device.

Consequently, it is possible to fix the mask 60 in position relative to the vapor deposition source 70.

The gap g2 between the vapor deposition source 70 and the mask 60 is desirably as small as possible for, for example, improvement in efficiency of use of the vapor deposition material.

Decreasing the distance between the vapor deposition source 70 and the mask 60, however, increases the temperature of the mask 60, which in turn expands the mask 60 and causes bending (slack) in the mask 60.

The present embodiment thus (i) applies tension to the mask 60 with use of the wind-off roll 91 and the wind-up roll 92 at opposite ends of the mask 60 which opposite ends are juxtaposed along the direction (that is, the long-side direction of the mask 60) perpendicular to the substrate scanning direction, and (ii) before vapor deposition onto the film formation substrate 200, carries out an alignment adjustment with reference to the absolute alignment reference markers 58 so that the mask 60 has its absolute dimensions (designed absolute values).

This allows the mask 60 to be placed at the absolute position, thus adjusting the position of the mask 60 relative to the vapor deposition source 70.

In the present embodiment, as illustrated in FIG. 5, the alignment markers 64 and 65 are circular in shape, whereas the opening 66 is quadrangular in shape. The respective shapes of the alignment markers 64 and 65 and the opening 66 are, however, not limited to the above shapes.

The respective shapes of the alignment markers 64 and 65 and the opening 66 simply need to be shapes that facilitate the alignment and calculation along the parallel direction, and may thus each be any shape such as a quadrangle and a triangle.

In the present embodiment, the alignment marker 64 is an opening that is different in size from the opening of the alignment marker 65. The present embodiment is, however, not limited to such an arrangement.

Nevertheless, since the present embodiment uses one of the alignment markers 64 and 65 as an alignment center as described above, the alignment markers 64 and 65 are preferably different from each other in at least either size or shape in order to (i) make it clear which of the alignment markers 64 and 65 serves as an alignment center and which of the alignment markers 64 and 65 is used for checking parallelism and thus (ii) prevent misrecognition when image detection is carried out with respect to an image captured by the detector 95.

The above description has discussed an example case in which (i) one of the alignment markers 64 and 65 is used as an alignment center for the alignment between the absolute-alignment markers 63 and the absolute alignment reference marker 58, and (ii) the other alignment marker is used as an alignment marker for checking parallelism. The present embodiment is, however, not limited to such an arrangement. The present embodiment may alternatively be arranged such that both the alignment markers are used for the alignment between the absolute-alignment markers 63 and the absolute alignment reference marker 58.

Further, the mask 60 is preferably prepared to have a size smaller than design absolute dimensions (designed values) in consideration of, for example, expansion due to temperature. Further, the mask 60 is preferably adjusted to have assumed absolute dimensions or dimensions slightly smaller than such absolute dimensions in response to tension applied to the mask 60 during the alignment adjustment.

Still further, the alignment between the mask 60 and the vapor deposition source 70 is preferably carried out by (i) recognizing the absolute-alignment markers 63 and (ii) placing the mask 60 in the vapor deposition device 50 in a state in which either no tension or preferably a small tension is applied to the mask 60.

With the above arrangement, even in the case where the distance between the vapor deposition source 70 and the film formation substrate 200 is decreased for a higher efficiency of use of the material, the vapor deposition position can be finely adjusted by (i) preparing in advance a mask 60 with a size smaller than designed values to absorb thermal expansion of the mask 60 and (ii) applying tension to the mask 60 with reference to the absolute alignment reference marker 58 so that the mask 60 is placed at the absolute position (corresponding to the designed absolute values). The above arrangement can further control thermal deformation of the mask 60.

Although FIG. 1 illustrates an example case where the absolute alignment reference markers 58 are provided on a top wall side of the vacuum chamber 51 while the detector 95 is provided below the mask 60, the present embodiment is not limited to such an arrangement.

For example, in a case where the mask 60 and the vapor deposition source 70 are fixed in the vacuum chamber 51 so that the mask unit 54 is not moved relative to the film formation substrate 200, the absolute alignment reference markers 58 may be provided on a bottom wall side of the vacuum chamber 51.

Therefore, in this case, the absolute-alignment markers 63 can be recognized by using, as the detector 95, for example, a CCD-equipped image sensor that is provided outside the vacuum chamber 51 and serves as image sensing means (image reading means).

As described above, according to the present embodiment, the mask 60 is constituted by the mask base material having patterns periodically formed which patterns are identical in form to each other and each include an opening 61 for forming a film formation pattern, wherein the mask base material, except for its region having a one-period pattern (one-period pattern being used) which is held by the mask-to-substrate distance adjusting members 80, is wound around the wind-off roll 91 and the wind-up roll 92, a length of the mask base material along a direction perpendicular to a long-side direction of the mask base material is shorter than a length of a film formation substrate 200 along a direction of scanning of the film formation substrate 200, and vapor deposition is carried out in such a manner that the mask 60 is provided so that the long-side direction of the mask base material is perpendicular to the direction of scanning.

This eliminates adhesion of the vapor deposition particles on the mask base material wound around the wind-off roll 91 and the wind-up roll 92, during the vapor deposition carried out while at least a first one of the film formation substrate 200 and the mask unit 54 is moved relative to a second one, as described above. Thus, with the wind-off roll 91 and the wind-up roll 92 provided along the long-side direction of the mask base material, it is possible to carry out vapor deposition while at least a first one of the film formation substrate 200 and the mask unit 54 is moved relative to a second one, with use of a mask 60 constituted by a mask base material having a length that extends along a direction perpendicular to a long-side direction of the mask base material and that is shorter than a length of the film formation substrate 200 along the direction of scanning of the film formation substrate 200.

Further, the above arrangement allows shortening a mask length that extends along the scanning direction, thus downsizing a mask and preventing the mask from being bent by weight of the mask itself.

Further, according to the present embodiment, the mask 60 which is arranged such that the whole mask base material, except for its region (mask region) having a one-period pattern being used, is wound around the wind-off roll 91 and the wind-up roll 92 so as to be formed into roll forms, as described above, is placed along a direction perpendicular to the direction of scanning of the film formation substrate 200 or the mask unit 54, and mask replacement is carried out by a winding-up/winding-off method every time the vapor deposition device reaches a predetermined number of substrate processing iterations or meets other predetermined criteria (criterion) for updating.

Generally, it is difficult, in terms of mechanism of a vapor deposition device, to continuously replace, in a vacuum, one sheet of mask (a single sheet of mask) being held under tension by another sheet of mask in a short length of time. In addition, it takes long hours to replace such a mask. Such mask replacement therefore results in a prolonged tact time and increase in cost of manufacturing a vapor deposition device, and also requires a vapor deposition device of a huge size. Further, there is a limit to the extent to which vapor deposition to a long batch of substrate is continuously repeated, because such vapor deposition causes clogging of a mask.

On the contrary, according to the present embodiment, the mask 60 wound around the rolls as described above is used, and an exposed surface of the mask 60 is sequentially updated. This makes it possible to carry out updating to a mask pattern which has openings of a high level of integrity, while maintaining a vacuum. In addition, it is possible to carry out vapor deposition with respect to a long batch of substrate with a simple structure.

Moreover, according to the present embodiment, mask replacement made by mask updating, i.e. exposure of a fresh surface (a region including an unused one-period pattern) of a mask, can be carried out very easily, because all that is required to make such mask replacement is to wind up and off the mask with use of the rolls (i.e. winding-off/winding-up). Therefore, it is possible to carry out mask replacement realized by frequent mask updatings. Consequently, it is possible to resolve the clogging problem which arises in the conventional technique.

Further, the used mask 60, which is formed into a roll form, can be easily retrieved from the device. Besides, the mask itself allows easy installation.

According to the present embodiment, the above arrangement can achieve shortening a time required for mask replacement, throughput enhancement, and cost reduction.

Further, the mask 60 is easy to handle, as described above. The mask 60 therefore has an advantage of increasing its workability, for example, in a case where the organic material adhered to the mask surface is to be collected.

Still further, according to the present embodiment, it is possible to readily and independently adjust tension to be applied to the mask 60, while controlling a distance between the film formation substrate 200 and the mask 60 (mask-to-substrate distance) to a predetermined value. This makes it possible to compensate for misalignment between the film formation substrate 200 and the mask 60 which misalignment is caused by variation in finishing of the mask 60 or finishing of the film formation substrate 200. This allows improvement in productivity such as increase in yield.

Yet further, according to the present embodiment, a mechanism for adjusting tension (the wind-off roll 91 and the wind-up roll 92) also serves as a mechanism for updating (replacing) the mask 60. This eliminates the need for separately providing the mechanism for adjusting tension and the mechanism for updating. This makes it possible to prevent increase in number of constituent elements, thus simplifying the vapor deposition device.

Further, according to the present embodiment, as described above, it is possible to adjust a mask tension with use of the wind-off roll 91 and the wind-up roll 92, and to adjust thermal expansion or the like expansion of the mask 60 by means of tension. This makes it possible to increase alignment accuracy and to thus form a pixel pattern with a higher accuracy.

Still further, a mask tension change associated with the operation for adjustment of the mask-to-substrate distance with use of the mask-to-substrate distance adjusting members 80 can be cancelled out by tension control using the wind-off roll 91 and the wind-up roll 92. This allows the mask-to-substrate distance adjusting members 80 to control the mask-to-substrate distance with high precision, without the need for consideration of tension of the mask 60. It is therefore possible to carry out vapor deposition with high accuracy.

Yet further, according to the present embodiment, as described above, separately from the mechanism for tension adjustment (the wind-off roll 91 and the wind-up roll 92), there are provided the mask-to-substrate distance adjusting members 80 that adjust the mask-to-substrate distance. Therefore, the mask-to-substrate distance does not change even when the tension adjustment is carried out with use of the wind-off roll 91 and the wind-up roll 92. Thus, it is possible to carry out vapor deposition with high accuracy.

Consequently, according to the present embodiment, it is possible to provide a vapor deposition device and a vapor deposition method both of which achieve a high patterning accuracy even for processing of a large substrate and yield a high throughput.

The present embodiment has described an example case in which (i) the organic EL display device 1 includes a TFT substrate 10 and (ii) an organic layer is formed on the TFT substrate 10. The present invention is, however, not limited to such an arrangement. The present invention may alternatively be arranged such that (i) the organic EL display device 1 includes not a TFT substrate 10 but, as a substrate on which an organic layer is to be formed, a passive substrate including no TFT, or that (ii) the film formation substrate 200 is such a passive substrate.

The present embodiment has described an example case of, as described above, forming an organic layer on a TFT substrate 10. The present invention is, however, not limited to such an arrangement. The present invention is suitably applicable to a case of forming an electrode pattern instead of an organic layer. The vapor deposition device 50 and vapor deposition method of the present invention, as described above, suitably applicable to, other than the method for producing the organic EL display device 1, any production method and production device for forming a patterned film by vapor deposition.

[Embodiment 2]

Figure 12:
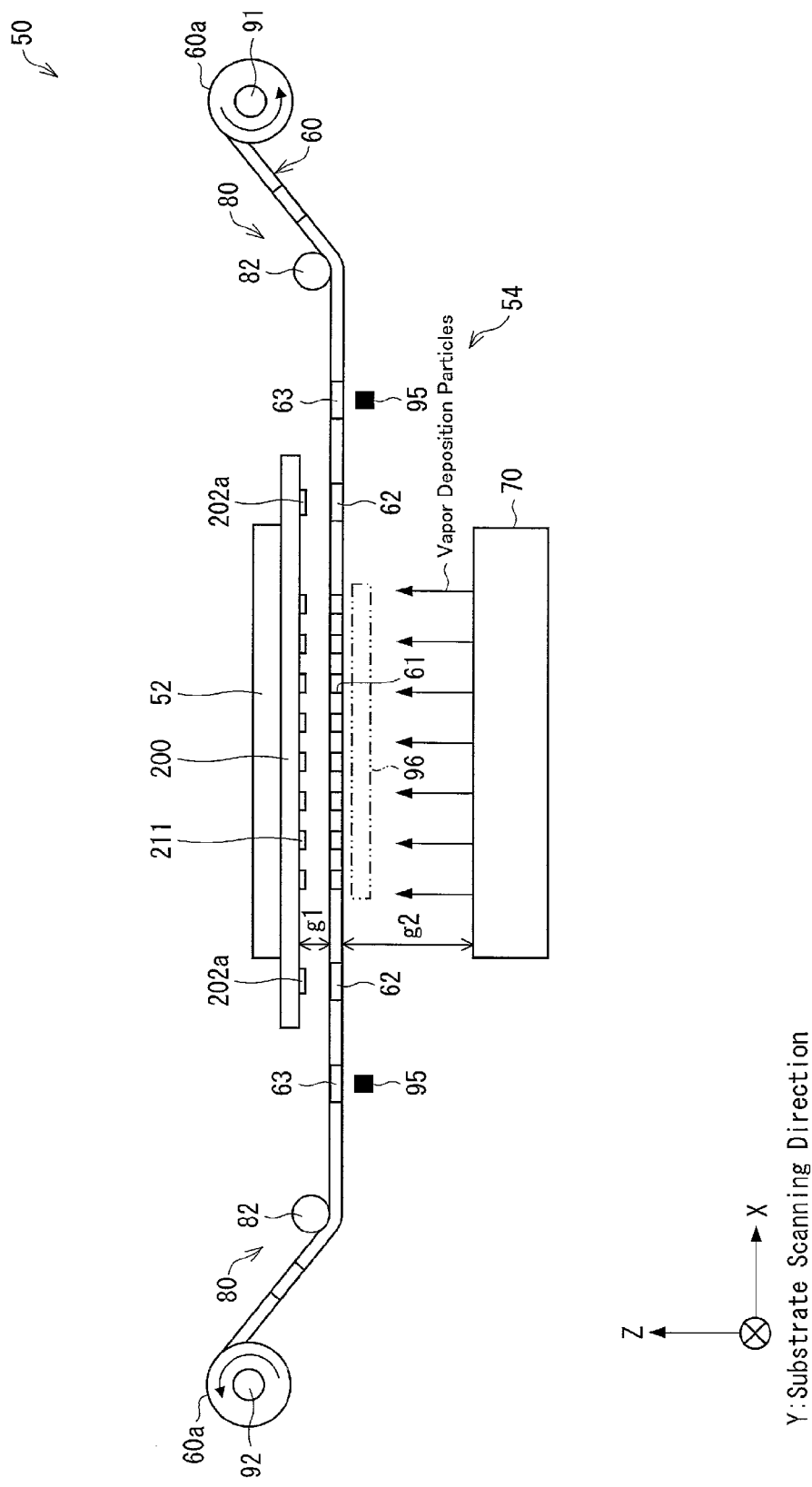
FIG. 12 is a side view illustrating main constituent elements provided inside a vacuum chamber of a vapor deposition device in accordance with Embodiment 2 of the present invention.

The following will describe the present embodiment mainly with reference to FIG. 12.

The present embodiment mainly deals with differences from Embodiment 1. Constituent elements of the present embodiment having identical functions to those described in Embodiment 1 are given the same reference numerals, and are not explained repeatedly.

FIG. 12 is a side view illustrating main constituent elements provided inside the vacuum chamber 51 of the vapor deposition device 50 in accordance with the present embodiment.

As illustrated in FIG. 12, the vapor deposition device 50 according to the present embodiment is different from the vapor deposition device 50 according to Embodiment 1 in that the mask-to-substrate distance adjusting members 80 are provided on a side of the mask 60 which side is opposite to a side thereof facing the vapor deposition source 70, and in that the wind-off roll 91 and the wind-up roll 92 are provided at positions respectively opposite to the vapor deposition source 70 with respect to the mask holding members 82 of the mask-to-substrate distance adjusting members 80.

That is, the vapor deposition device 50 according to the present embodiment is arranged such that, when viewed from the vapor deposition source 70, the wind-off roll 91 and the wind-up roll 92 are placed above a region of the mask 60 (a flattened portion of the mask) which region lies between the mask-to-substrate distance adjusting members 80 provided oppositely, although the wind-off roll 91 and the wind-up roll are placed below such a region of the mask 60 in Embodiment 1. Correspondingly, the mask-to-substrate distance adjusting members 80 are placed above the mask 60.

Note that not only the other arrangements are the same as those described above in Embodiment 1, but also a procedure for film formation and others are the same as those described above in Embodiment 1.

According to the present embodiment, as described above, the mask-to-substrate distance adjusting members 80 are provided on a side of the mask 60 which side is opposite to a side thereof having the vapor deposition particles (the vapor-deposited object 212 such as an organic material) adhered thereon. This eliminates the mask-to-substrate distance adjusting members 80, particularly the mask holding members 82 (mask holding rollers), from being soiled with the vapor deposition particles. This makes it possible to carry out a smooth operation all the time.

This makes it possible to carry out highly precise control with use of the mask-to-substrate distance adjusting members 80 over a long period of time, to increase finishing accuracy of a film formation pattern, and to obviate the trouble of cleaning, thus enhancing productivity.

In the present embodiment as well as in Embodiment 1, the mask-to-substrate distance is kept (i) by tension applied by the wind-off roll 91 and the wind-up roll 92 and (ii) by the mask-to-substrate distance adjusting members 80 which support the mask 60.

In the present embodiment as well as in Embodiment 1, the above-described up-and-down mechanisms 81 (see FIG. 1) of the mask-to-substrate distance adjusting members 80 can each be an actuator, a slider, or the like which converts a control signal into movement in a Z-axis direction (up-and-down direction).

[Embodiment 3]

Figure 13:
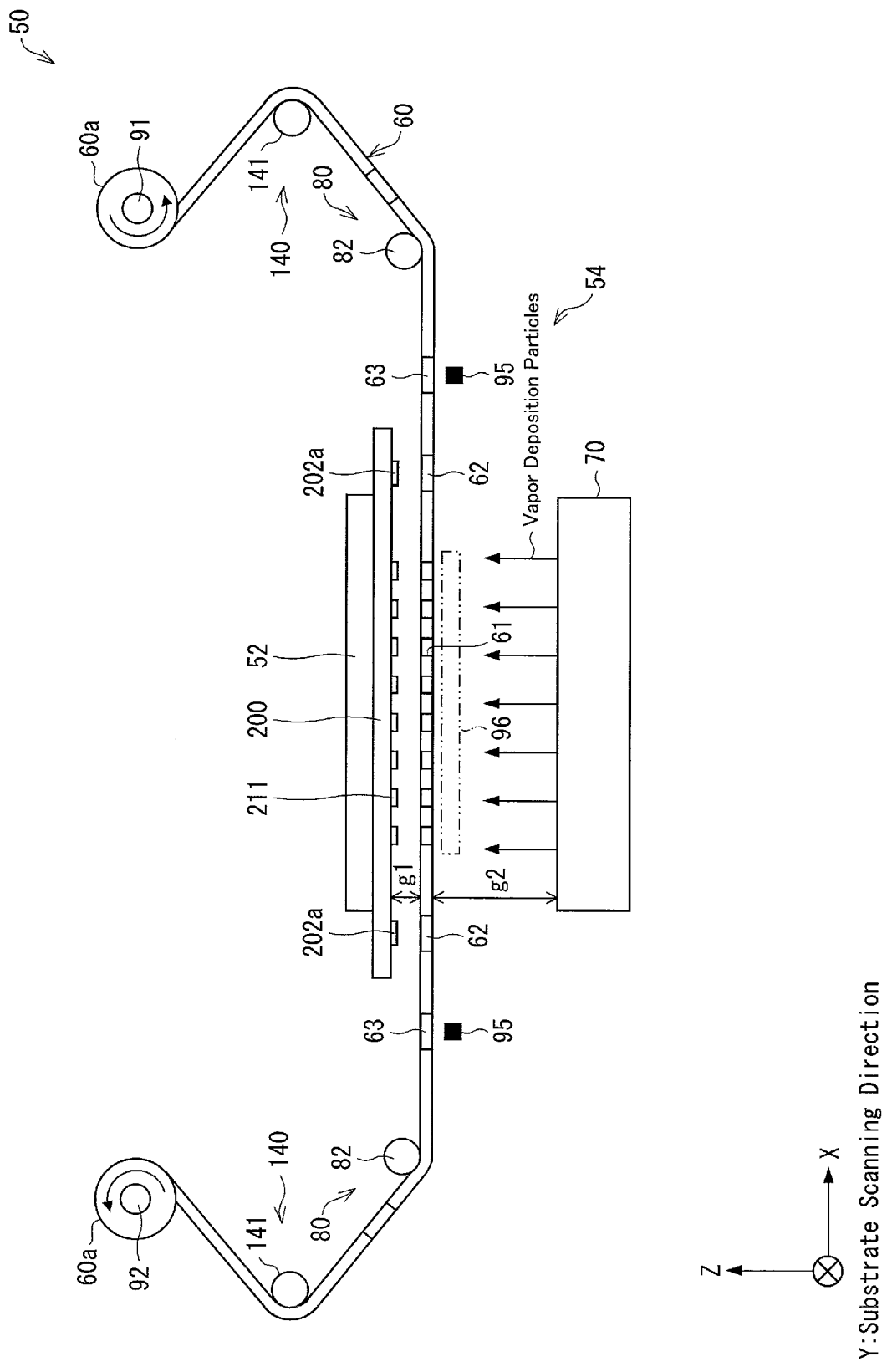
FIG. 13 is a side view illustrating main constituent elements provided inside a vacuum chamber of a vapor deposition device in accordance with Embodiment 3 of the present invention.

The following will describe the present embodiment mainly with reference to FIG. 13.

The present embodiment mainly deals with differences from Embodiments 1 and 2 (particularly, differences from Embodiment 2). Constituent elements of the present embodiment having identical functions to those described in Embodiments 1 and 2 are given the same reference numerals, and are not explained repeatedly.

FIG. 13 is a cross-sectional view illustrating main constituent elements provided inside the vacuum chamber 51 of the vapor deposition device 50 in accordance with the present embodiment.

As illustrated in FIG. 13, the vapor deposition device 50 according to the present embodiment is different from the vapor deposition device 50 according to Embodiment 2 in that the mask unit 54 further includes at least a pair of mask tension control members 140 that adjust tension of the mask 60 by contacting a first portion of the mask 60 which portion lies between the wind-off roll 91 and a first one of the mask-to-substrate distance adjusting members 80 and contacting a second portion of the mask 60 which portion lies between the wind-up roll 92 and a second one of the mask-to-substrate distance adjusting members 80, so that tension of the mask 60 is adjusted by these mask tension control members 140. Note that the other arrangements are the same as those described above in Embodiment 2.

The mask tension control members 140 can adjust tension applied to the mask 60, by operating (moving), for example, in a left-and-right direction with use of a moving mechanism (sliding mechanism) (not shown).

As in the case of the mask-to-substrate distance adjusting members 80, each of the mask tension control members 140 desirably has a rotation mechanism 141 in a roller form that rotates in contact with the mask 60 at a position where the rotation mechanism 141 contacts the mask 60, in order not to prevent the winding-off/winding-up operation of the mask 60.

As the rotation mechanism 141, for example, a roller provided rotatably can be used. More specifically, for example, as in the case of the mask holding member 82, a cylindrical roller which rotates in contact with the mask 60 and has a length longer than a short-side length of the mask 60 is suitably used as the rotation mechanism 141.

Note that the moving mechanism can be, but is not particularly limited to, a publicly known slider or the like.

The present embodiment has described an example case in which the mask tension control members 140 are provided respectively between a first one of the mask-to-substrate distance adjusting members 80 and the wind-off roll 91 and between a second one of the mask-to-substrate distance adjusting members 80 and the wind-up roll 92. However, the present embodiment is not limited to this arrangement.

The mask tension control members 140 simply need to adjust tension of the mask 60. Alternatively, two or more mask tension control members 140 may be provided between the first one of the mask-to-substrate distance adjusting members 80 and the wind-off roll 91, and two or more mask tension control members 140 may be provided between the second one of the mask-to-substrate distance adjusting members 80 and the wind-up roll 92.

In the present embodiment as well as in Embodiment 2, the mask-to-substrate distance adjusting members 80 are provided on a side of the mask 60 which side is opposite to a side thereof having the vapor deposition particles (the vapor-deposited object 212 such as an organic material) adhered thereon. This eliminates the mask-to-substrate distance adjusting members 80, particularly the mask holding members 82 (mask holding rollers), from being soiled with the vapor deposition particles.

As in the case of the mask-to-substrate distance adjusting members 80, the mask tension control members 140 are provided on a side of the mask 60 which side is opposite to a side thereof having the vapor deposition particles adhered thereon. This eliminates the mask tension control members 140 from being soiled with the vapor deposition particles.

This makes it possible to carry out highly precise control with use of the mask-to-substrate distance adjusting members 80 over a long period of time, to increase finishing accuracy of a film formation pattern, and to save the trouble of cleaning, thus enhancing productivity.

According to the present embodiment, as described above, it is possible to adjust tension to be applied to the mask 60, with use of the mask tension control members 140.

It is therefore possible to adjust thermal expansion or the like expansion of the mask 60 by means of tension. This makes it possible to increase alignment accuracy and to thus form a pixel pattern with a higher accuracy.

Further, a mask tension change associated with the operation for adjustment of the mask-to-substrate distance with use of the mask-to-substrate distance adjusting members 80 can be cancelled out by tension control using the mask tension control members 140. This allows the mask-to-substrate distance adjusting members 80 to control the mask-to-substrate distance with high precision, without the need for consideration of tension of the mask 60. It is therefore possible to carry out vapor deposition with high accuracy.

Still further, in the present embodiment as well as in the foregoing embodiments, the mask-to-substrate distance adjusting members 80 that adjust the mask-to-substrate distance are provided, as described above. Therefore, the mask-to-substrate distance does not change even when the tension adjustment of the mask 60 is carried out as described above. Thus, it is possible to carry out vapor deposition with high accuracy.

As a result of this, it is possible to readily and independently adjust tension to be applied to the mask 60, while controlling a distance between the film formation substrate 200 and the mask 60 to a predetermined value with use of the mask-to-substrate distance adjusting members 80. This makes it possible to compensate for misalignment between the film formation substrate 200 and the mask 60 which misalignment is caused by variation in finishing of the mask 60 or finishing of the film formation substrate 200. This allows improvement in productivity such as increase in yield.

For adjustment of tension of the mask 60, tension adjustment made by the mask tension control members 140 and tension adjustment made by the wind-off roll 91 and the wind-up roll 92 may be carried out together.

However, according to the present embodiment, as described above, since the mask tension control members 140 are provided separately to adjust tension of the mask 60, a fine torque adjustment using the wind-off roll 91 and wind-up roll 92 is not necessary for the tension adjustment of the mask 60 with use of the wind-off roll 91 and the wind-up roll 92.

Therefore, with tension adjustment made by the mask tension control members 140, it is possible to realize more precise tension control, and to thus form a film with a higher accuracy.

According to the present embodiment, the mask-to-substrate distance can be retained (i) by tension applied by the mask tension control members 140 and (ii) by the mask-to-substrate distance adjusting members 80 which support the mask 60.

Thus, according to the present embodiment, it is not necessary to adjust tension of the mask 60 with use of the wind-off roll 91 and the wind-up roll 92, as described above. This allows the wind-off roll 91 and the wind-up roll 92 to be arranged rotatably and obviates provision of a mechanism for finely controlling tension.

In this case, the wind-off roll 91 and the wind-up roll 92 are so provided as to be rotatable in one direction and each simply needs to include at least a mechanism for locking the roll from winding off.

Therefore, it is possible to greatly simplify a mask roll mechanism by the wind-off roll 91 and the wind-up roll 92.

[Embodiment 4]

Figure 14:
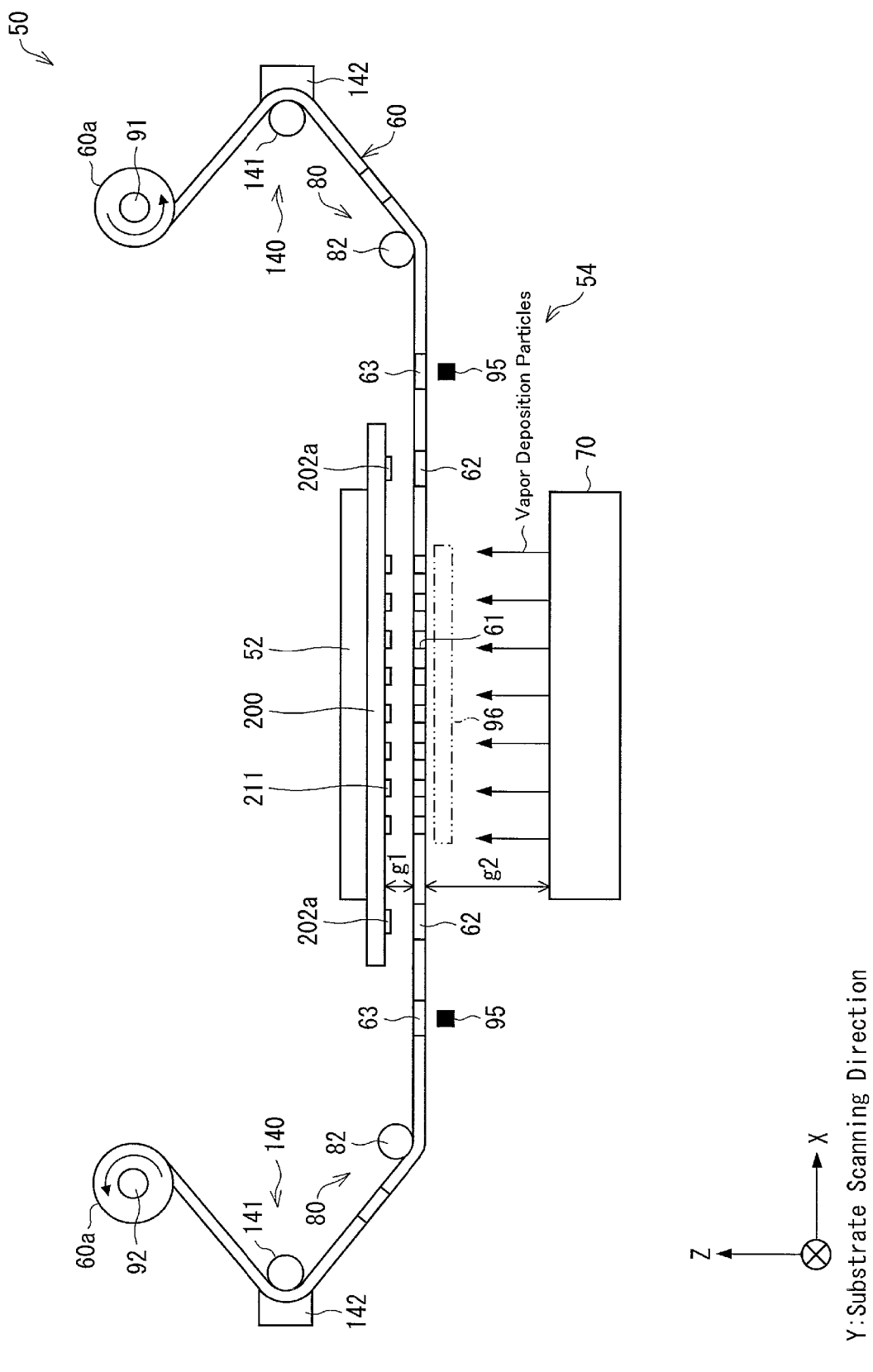
FIG. 14 is a side view illustrating main constituent elements provided inside a vacuum chamber of a vapor deposition device in accordance with Embodiment 4 of the present invention.

The following will describe the present embodiment mainly with reference to FIG. 14.

The present embodiment mainly deals with differences from Embodiments 1 through 3 (particularly, differences from Embodiment 3). Constituent elements of the present embodiment having identical functions to those described in Embodiments 1 through 3 are given the same reference numerals, and are not explained repeatedly.

FIG. 14 is a cross-sectional view illustrating main constituent elements provided inside the vacuum chamber 51 of the vapor deposition device 50 according to the present embodiment.

The vapor deposition device according to the present embodiment is different from the vapor deposition device according to Embodiment 3 in that the mask tension control members 140 are clamp-type mask tension control members. Note that the other arrangements the same as those described above in Embodiment 3.

According to the present embodiment, as illustrated in FIG. 14, clamps 142 are provided to the respective mask tension control members 140. This makes it possible to securely fix the mask 60 in a state in which the mask 60 is under tension. It is therefore possible to carry out stronger and finer tension control. Consequently, it is possible to form a film with a higher accuracy.

There is the possibility that the vapor-deposited object 212 (vapor deposition particles, organic object) having been adhered to the mask 60 is adhered to the clamp 142 to some extent. However, such adhesion of the vapor-deposited object 212 to the clamp 142 does not incur decrease in performance of holding the mask 60, since the clamp 142 is a member for tightly fixing the mask 60.

According to the present embodiment, the mask tension control members 140 can have the function of adjusting tension of the mask 60, and the mask 60 can be securely fixed in a state in which the mask 60 is under tension, as described above. This makes it possible to extend the range of choices of the mask 60.

The mask 60 can be securely held by the clamps 142 even when the mask 60 has been subjected to some kind of treatment, for example, such as increase in mask surface smoothness of the mask 60, using a low-friction material as the mask base material, or subjecting the mask base material to low-friction coating, for example, in order that the mask 60 can be smoothly wound off and wound up by the wind-off roll 91 and the wind-up roll 92.

Further, it is possible to apply a stronger tension to the mask 60. This makes it possible to use a thicker mask base material or the like.

In a case where the clamps 142 are provided to the respective mask tension control members 140 as described above, separation of the mask 60 from the clamps 142 is carried out for the mask updating. Thereafter, the mask 60 undergoes winding-off/winding-up and rough alignment, and is then fixed again by the clamps 142.

Note that the concept of fixing a mask by the clamps is effective in other embodiments as well as in Embodiment 4. For example, it goes without saying that the above-described clamp-type mask tension control members 140 are additionally provided in Embodiment 1.

[Embodiment 5]

Figure 15:
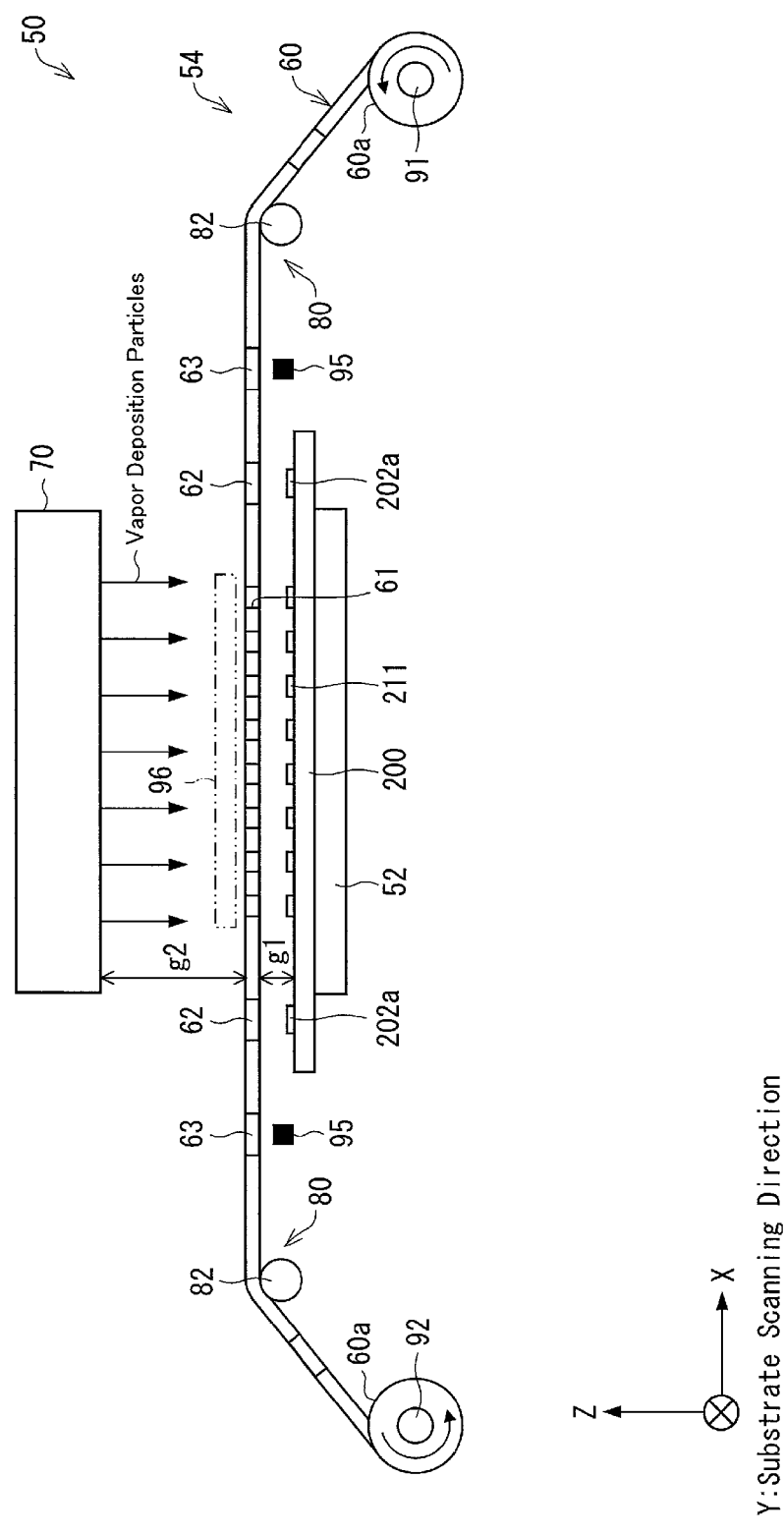
FIG. 15 is a side view illustrating main constituent elements provided inside a vacuum chamber of a vapor deposition device in accordance with Embodiment 5 of the present invention.

The following will describe the present embodiment mainly with reference to FIG. 15.

The present embodiment mainly deals with differences from Embodiments 1 through 4 (particularly, differences from Embodiment 1). Constituent elements of the present embodiment having identical functions to those described in Embodiments 1 through 4 are given the same reference numerals, and are not explained repeatedly.

FIG. 15 is a cross-sectional view illustrating main constituent elements inside the vacuum chamber 51 of the vapor deposition device 50 according to the present embodiment.

In Embodiments 1 through 4 has described an example case in which the vapor deposition source 70 includes a mechanism for injecting vapor deposition particles upward.

That is, in Embodiments 1 through 4, the vapor deposition source 70 is provided below the film formation substrate 200, and the film formation substrate 200 is held by the substrate holding member 52 in such a state that the vapor-deposited surface of the film formation substrate 200 faces downward. Thus, the vapor deposition source 70 carries out vapor deposition of vapor deposition particles through the openings 61 of the mask 60 onto the film formation substrate 200 upward from below (that is, up deposition). However, the present invention is not limited to this arrangement.

The vapor deposition device 50 according to the present embodiment is different from the vapor deposition device 50 according to Embodiment 1, as illustrated in FIG. 15, in that the mask unit 54 and the film formation substrate 200 are brought into inverted positions.

It goes without saying that, with the arrangement in which the mask unit 54 and the film formation substrate 200 are brought into inverted positions, the substrate holder 52, the substrate moving mechanism 53, and the mask unit moving mechanism 55 are brought into inverted positions (not illustrated in FIG. 15).

The holding means for holding the mask unit 54 in the case where the mask unit 54 and the film formation substrate 200 are brought into inverted positions as described above is not particularly limited as long as the holding means can hold the mask unit 54 in a state in which the mask 60 and the vapor deposition source 70 are fixed in position relative to each other.

For example, the mask unit 54 may be alternatively arranged such that the mask 60 and the vapor deposition source 70 are held integrally with each other by mask holding means (not illustrated in FIG. 15), such as a holder, which is fixed to the vacuum chamber 51 and in which the mask 60 and the vapor deposition source 70 are, for example, placed to be contained and fixed.

In the case where the mask unit 54 is fixed and the film formation substrate 200 is moved relative to the mask unit 54, the present embodiment may be arranged, for example, such that (i) the vapor deposition source 70 is directly fixed to the top wall of the vacuum chamber 51 and that (ii) the mask-to-substrate distance adjusting members 80 are fixed to any of the inner walls of the vacuum chamber 51. The present embodiment may alternatively be arranged such that (i) the top wall of the vacuum chamber 51 is provided with top windows in correspondence with the injection holes 71 of the vapor deposition source 70 and that (ii) the body of the vapor deposition source 70 is positioned (placed) outside the vacuum chamber 51. Regardless of the arrangement, the mask unit 54 simply needs to be arranged such that the mask 60 and the vapor deposition source 70 are fixed in position relative to each other.

The present embodiment is, as illustrated in FIG. 15, arranged such that the vapor deposition source 70 and the mask 60 are provided above the film formation substrate 200. This causes vapor deposition particles to be injected downward from the injection holes 71 of the vapor deposition source 70.

The vapor deposition source 70 includes a mechanism for injecting vapor deposition particles downward. Vapor deposition particles injected by the vapor deposition source 70 pass through the openings 61 of the mask 60 to be deposited in the panel region 201 of the film formation substrate 200 which is passing a position below the mask 60.

More specifically, while the vapor deposition method described in Embodiment 1 above carries out vapor deposition by up deposition, the present embodiment is arranged such that, as described above, (i) the vapor deposition source 70 is provided above the film formation substrate 200 and that, as described above, (ii) vapor deposition particles pass through the openings 61 of the mask 60 to be deposited onto the film formation substrate 200 downward from above (that is, down deposition).

For such down deposition, as illustrated in FIG. 15, even in a case where the wind-off roll 91 and the wind-up roll 92, when viewed from the vapor deposition source 70, are placed below a region of the mask 60 (a flattened portion of the mask) which region lies between the mask-to-substrate distance adjusting members 80 provided oppositely, as described in Embodiment 1, the mask-to-substrate distance adjusting members 80 can be provided on a side of the mask 60 which side is opposite to a side thereof facing the vapor deposition source 70, as in Embodiments 2 through 4.

In the present embodiment as well as in Embodiments 2 through 4, the above arrangement eliminates the mask-to-substrate distance adjusting members 80, particularly the mask holding members 82 (mask holding rollers), from being soiled with the vapor deposition particles. This makes it possible to carry out a smooth operation all the time.

This makes it possible to carry out highly precise control with use of the mask-to-substrate distance adjusting members 80 over a long period of time, to increase finishing accuracy of a film formation pattern, and to obviate the trouble of cleaning, thus enhancing productivity.

In Embodiment 1 described above, the film formation substrate 200 has been adhered and fixed to the substrate holder 52 by an electrostatic chuck or the like means, in order to prevent self-weight bending of the film formation substrate 200. In contrast, the present embodiment, which carries out vapor deposition by down deposition as described above, simply needs to hold the film formation substrate 200 in a manner sufficient to prevent self-weight bending thereof, without using the electrostatic chuck or the like means.

According to the present embodiment, it is thus possible to make the structure of the vapor deposition device 50 simpler than that of Embodiment 1 and to eliminate the risk of a large-sized film formation substrate 200 dropping due to adhesion defect. The present embodiment can consequently increase stability in operation of the vapor deposition device 50 and improve yield.

<Variations>

The present embodiment describes a case of carrying out down deposition with respect to the film formation substrate 200. The present invention is, however, not limited to such an arrangement.

The present invention may alternatively be arranged, for example, such that (i) the vapor deposition source 70 includes a mechanism for injecting vapor deposition particles in a lateral direction and that (ii) such vapor deposition particles are deposited (side deposition) onto the film formation substrate 200 in a lateral direction through the mask 60 in a state in which the film formation substrate 200 is stood vertically in such a manner that the vapor-deposited surface (film formation surface) thereof faces the vapor deposition source 70 side.

In this case as well, it is possible to achieve the same effect as in Embodiments 2 through 4, by providing the mask-to-substrate distance adjusting members 80 on a side of the mask 60 which side is opposite to a side thereof facing the vapor deposition source 70.

Further, the present embodiment may be arranged such that the mask unit 54 further includes the mask tension control members 140, which are described in Embodiments 3 and 4, regardless of whether the vapor deposition is up deposition, down deposition or side deposition.

[Embodiment 6]

The following will describe the present embodiment mainly with reference to (a) and (b) of FIG. 16.

The present embodiment mainly deals with differences from Embodiments 1 through 5 (particularly, differences from Embodiment 1). Constituent elements of the present embodiment having identical functions to those described in Embodiments 1 through 5 are given the same reference numerals, and are not explained repeatedly.

The present embodiment describes a case where scanning is carried out in a state in which the film formation substrate 200 and the mask 60 are in contact with each other.

(a) and (b) of FIG. 16 are cross-sectional views illustrating how the film formation substrate 200 and the mask 60 used in the present embodiment are arranged in the vicinity of one of the openings 61 of the mask 60 for vapor deposition in a state in which the film formation substrate 200 and the mask 60 are in contact with each other.

That is, in the present embodiment, vapor deposition is carried out in such a state that a distance (gap $g1$) between the film formation substrate 200 and the mask 60 is retained to be $g1=0$.

The present embodiment, as illustrated in (a) of FIG. 16, uses a film formation substrate 200 including partition walls 203 (protrusions) that (i) are provided along opposite ends (that is, long sides 61b) of each of the openings 61 formed in the mask 60 which ends are positioned along a direction perpendicular to the substrate scanning direction and that (ii) protrude from the film formation surface of the film formation substrate 200.

As indicated in Patent Literature 2 or Patent Literature 3, in a case where vapor deposition is carried out while a long-length flexible substrate used as the film formation substrate and a long-length mask, which is so formed as to be identical in size to the film formation substrate, are moved in the substrate scanning direction in synchronization with each other, the mask does not come into contact with a pattern formed on the film formation substrate. This makes it possible to carry out vapor deposition while the flexible substrate and the mask are wound off.

However, in the case where a long-length mask which is so formed as to be identical in size to the film formation substrate, and vapor deposition is carried out while the long-length flexible substrate and a long-length mask, which is so formed as to be identical in size to the film formation substrate, are moved in the substrate scanning direction in synchronization with each other, the mask needs to be large in size, which requires the vapor deposition device itself to be large. In addition, replacement of the mask becomes difficult at the stage of finally replacing the whole mask with another.

These problems, however, do not occur in a case where vapor deposition is carried out, as illustrated in FIGS. 2 and 3, by moving at least a first one of the film formation substrate 200 and the mask unit 54 relative to a second one, with use of the mask 60 being arranged such that a length of the mask base material along a direction perpendicular to a long-side direction of the mask base material (that is, a mask length extending along the substrate scanning direction) is shorter than a length of the film formation substrate 200 along a direction of scanning of the film formation substrate 200.

However, in this case, vapor deposition with the film formation substrate 200 and the mask 60 in contact with each other cannot be carried out with use of the mask 60 being not processed.

In view of this, if vapor deposition is carried out with use of the film formation substrate 200 as illustrated in (a) of FIG. 16, the vapor-deposited film 211 formed on the film formation substrate 200 does not contact the mask 60 even in a case where vapor deposition is carried out, as illustrated in FIGS. 2 and 3, by moving at least a first one of the film formation substrate 200 and the mask unit 54 relative to a second one, with use of the mask 60 being arranged such that a length of the mask base material along a direction perpendicular to a long-side direction of the mask base material (that is, a mask length extending along the substrate scanning direction) is shorter than a length of the film formation substrate 200 along a direction of scanning of the film formation substrate 200. Therefore, it is possible to carry out vapor deposition in a state in which the film formation substrate 200 and the mask 60 are in contact with each other or in a state in which the film formation substrate 200 and the mask 60 are close to each other.

With such a film formation substrate 200, vapor deposition particles that have fallen through the mask 60 in an oblique direction are blocked by the partition walls 203. Such vapor deposition particles, which would otherwise be undesirably scattered, are inevitably contained within a target pixel. The amount of such undesirable scattering thus does not depend on the angle of entry of vapor deposition particles or the height of the partition walls 203. Further, the present embodiment can reliably prevent color mixture and property impairment from occurring due to undesirable scattering of vapor deposition particles into adjacent pixels.

Further, in a case where the film formation substrate 200 being provided with the partition walls 203 on the film formation surface is used, the mask 60 may have depressed portions 67 which are provided, in correspondence with the partition walls 203, at opposite ends (that is, long sides 61*b*) of each of the openings 61 formed in the mask 60 which ends are positioned along a direction perpendicular to the substrate scanning direction (see (*b*) of FIG. 16).

With this arrangement, when the film formation substrate 200 and the mask 60 are brought into contact with each other at the partition walls 203, the partition walls 203 are engaged with (fit into) the depressed portions 67 and then slide over the mask 60. This eliminates the need to carry out separate alignment and decreases a tact time.

The depressed portions 67 can be easily formed by photolithography and by adjustment of an etching period.

The partition walls 203 can be made of a photosensitive permanent film resist for a thick film, for example, a product in the SU-8 series available from Nippon Kayaku Co., Ltd. or a product in the KI-1000 series available from Hitachi Chemical Co., Ltd. The partition walls 203 can be formed by subjecting a material as above to patterning by photolithography and firing the patterned material.

<Main Points>

As described above, a vapor deposition device in accordance with the foregoing embodiments is a vapor deposition device for forming a film having a predetermined pattern on a film formation substrate on which the film is to be formed, by depositing vapor deposition particles onto the film formation substrate through an opening of a vapor deposition mask, the vapor deposition device including: a substrate holding member holding the film formation substrate; a mask unit for forming the film having the predetermined pattern on the film formation substrate; and moving means for moving at least a first one of the mask unit and the substrate holding member relative to a second one so as to carry out scanning, the mask unit comprising: (i) a vapor deposition source operative to inject vapor deposition particles; (ii) a vapor deposition mask being constituted by a flexible mask base material having patterns periodically formed along a long-side direction of the mask base material, the patterns being identical in form to each other and each including the opening, wherein the vapor deposition mask is fixed in position relative to the vapor deposition source so that a direction perpendicular to a direction of scanning of the film formation substrate is the long-side direction of the mask base material, and a length of the mask base material along a direction perpendicular to the long-side direction of the mask base material is shorter than a length of the film formation substrate along the direction of scanning of the film formation substrate; (iii) a wind-off roll, provided at one of opposite ends of the vapor deposition mask which ends are positioned along the long-side direction of the vapor deposition mask, operative to wind the vapor deposition mask therearound; (iv) a wind-up roll, provided at the other end of the vapor deposition mask, operative to wind up the vapor deposition mask; and (v) at least a pair of mask-to-substrate distance adjusting members, the at least a pair of mask-to-substrate distance adjusting members operative to adjust a distance between the film formation substrate and a portion of the vapor deposition mask which portion lies between the at least a pair of mask-to-substrate distance adjusting members, in such a manner that at least one of the at least pair of mask-to-substrate distance adjusting members moves the vapor deposition mask in a direction perpendicular to a substrate surface of the film formation substrate, the vapor deposition mask being provided so that a region having a one-period pattern of a plurality of period patterns of the mask base material is so exposed as to be held in parallel to the film formation substrate by the mask-to-substrate distance adjusting members, that other region having the other period patterns is wound around the wind-off roll and the wind-up roll, and that the exposed region of the vapor deposition mask is allowed to move in the direction perpendicular to the scanning direction by rotation of the wind-off roll and the wind-up roll.

The above arrangement eliminates adhesion of the vapor deposition particles on the mask base material wound around the wind-off roll and the wind-up roll, during the vapor deposition carried out while at least a first one of the film formation substrate and the mask unit is moved relative to a second one. Thus, it is possible (i) to carry out vapor deposition while at least a first one of the film formation substrate and the mask unit is moved relative to a second one, and (ii) to shorten a mask length that extends along the scanning direction. This makes it possible to downsize a mask and to prevent the mask from being bent by weight of the mask itself.

Further, according to the above arrangement, it is possible to carry out sequential updating of the exposed region (a flattened surface of the mask) of the vapor deposition mask to the region including an unused one-period pattern (fresh surface).

Thus, it is possible to carry out updating to a mask pattern which has openings of a high level of integrity while maintaining a vacuum in the film growing chamber and without a need for removing the vapor deposition mask from the vapor deposition device. In addition, it is possible to carry out vapor deposition with respect to a long batch of substrate, with a simple structure.

Moreover, according to the above arrangement, exposure (mask updating) of the region including an unused one-period pattern can be carried out very easily because all that is required to make such mask updating is to wind up and off the vapor deposition mask (i.e. winding-off/winding-up). Therefore, it is possible to carry out frequent mask updatings. Consequently, it is possible to resolve the clogging problem which arises in the conventional technique.

Further, the used vapor deposition mask, which is formed into a roll form, can be easily retrieved from the device. Besides, the vapor deposition mask itself allows easy installation.

Thus, the above arrangement can achieve shortening a time required for mask replacement, throughput enhancement, and cost reduction.

Further, since the vapor deposition mask is easy to handle as described above, the vapor deposition mask has an advantage of increasing its workability, for example, in a case where the organic material adhered to the surface of the vapor deposition mask is to be collected.

According to the above arrangement, it is therefore possible to provide a vapor deposition device which achieves a high patterning accuracy and yields a high throughput.

Further, it is preferable that the wind-off roll and the wind-up roll are provided rotatably.

According to the above arrangement, not only it is possible to update a flattened surface of the mask to a fresh surface, but also rotation of the wind-off roll and the wind-up roll in opposite directions or rotation of one of the wind-off roll and the wind-up roll in a state where the other is stopped makes it possible to adjust tension applied to the vapor deposition mask.

It is thus possible to adjust thermal expansion or the like expansion of the vapor deposition mask by means of tension. This makes it possible to increase alignment accuracy and to thus form a pixel pattern with a higher accuracy.

Still further, a mask tension change associated with the operation for adjustment of a distance (mask-to-substrate distance) between the vapor deposition mask and the film formation substrate with use of the mask-to-substrate distance adjusting members can be cancelled out by tension control using the wind-off roll and the wind-up roll. This allows the mask-to-substrate distance adjusting members to control the mask-to-substrate distance with high precision, without the need for consideration of tension of the vapor deposition mask. It is therefore possible to carry out vapor deposition with high accuracy.

Yet further, according to the above arrangement, there are provided the mask-to-substrate distance adjusting members that adjust the mask-to-substrate distance, as described above. Therefore, the mask-to-substrate distance does not change even when the tension adjustment is carried out as described above. Thus, it is possible to carry out vapor deposition with high accuracy.

As a result of this, it is possible to readily and independently adjust tension to be applied to the vapor deposition mask, while controlling a distance between the film formation substrate and the vapor deposition mask to a predetermined value with use of the mask-to-substrate distance adjusting members. This makes it possible to compensate for misalignment between the film formation substrate and the vapor deposition mask which misalignment is caused by variation in finishing of the vapor deposition mask or finishing of the film formation substrate. This allows improvement in productivity such as increase in yield.

Further, it is preferable that the wind-off roll and the wind-up roll are provided at positions respectively opposite to the vapor deposition source with respect to the mask-to-substrate distance adjusting members, and that the mask-to-substrate distance adjusting members are provided on a side of the vapor deposition mask which side is opposite to a side thereof facing the vapor deposition source.

According to the above arrangement, the mask-to-substrate distance adjusting members are provided on a side of the vapor deposition mask which side is opposite to a side thereof having the vapor deposition particles adhered thereon.

This eliminates the mask-to-substrate distance adjusting members from being soiled with the vapor deposition particles. This makes it possible to carry out a smooth operation all the time.

This makes it possible to carry out highly precise control with use of the mask-to-substrate distance adjusting members over a long period of time, to increase finishing accuracy of a film formation pattern, and to obviate the trouble of cleaning, thus enhancing productivity.

Still further, it is preferable that the mask-to-substrate distance adjusting members include their respective rotation mechanisms which rotate in contact with the vapor deposition mask, in order not to prevent the wind-off roll from winding off the vapor deposition mask and prevent the wind-up roll from winding up the vapor deposition mask.

Yet further, it is preferable that the mask unit further includes at least a pair of mask tension control members which adjust tension of the vapor deposition mask by contacting a first portion of the vapor deposition mask which portion lies between the wind-off roll and a first one of the mask-to-substrate distance adjusting members and contacting a second portion of the vapor deposition mask which portion lies between the wind-up roll and a second one of the mask-to-substrate distance adjusting members.

According to the above arrangement, it is possible to adjust tension to be applied to the vapor deposition mask, with use of the mask tension control members.

It is thus possible to adjust thermal expansion or the like expansion of the vapor deposition mask by means of tension. This makes it possible to increase alignment accuracy and to thus form a pixel pattern with a higher accuracy.

Still further, a mask tension change associated with the operation for adjustment of a distance (mask-to-substrate distance) between the vapor deposition mask and the film formation substrate with use of the mask-to-substrate distance adjusting members can be cancelled out by tension control using the mask tension control members. This allows the mask-to-substrate distance adjusting members to control the mask-to-substrate distance with high precision, without the need for consideration of tension of the vapor deposition mask. It is therefore possible to carry out vapor deposition with high accuracy.

Yet further, according to the above arrangement, there are provided the mask-to-substrate distance adjusting members that adjust the mask-to-substrate distance, as described above. Therefore, the mask-to-substrate distance does not change even when the tension adjustment is carried out as described above. Thus, it is possible to carry out vapor deposition with high accuracy.

As a result of this, it is possible to readily and independently adjust tension to be applied to the vapor deposition mask, while controlling a distance between the film formation substrate and the vapor deposition mask to a predetermined value with use of the mask-to-substrate distance adjusting members. This makes it possible to compensate for misalignment between the film formation substrate and the vapor deposition mask which misalignment is caused by variation in finishing of the vapor deposition mask or finishing of the film formation substrate. This allows improvement in productivity such as increase in yield.

Further, according to the above arrangement, tension adjustment is carried out with use of the mask tension control members. Therefore, a fine torque adjustment using the wind-off roll and wind-up roll is not necessary for the tension adjustment of the vapor deposition mask with use of the wind-off roll and the wind-up roll, as described previously.

Therefore, with tension adjustment made by the mask tension control members, it is possible to realize more precise tension control, and to thus form a film with a higher accuracy.

With the above arrangement, it is also possible to adjust tension of the vapor deposition mask, without the above-described tension adjustment of the vapor deposition mask with use of the wind-off roll and the wind-up roll. This allows the wind-off roll and the wind-up roll to have simple configurations.

Yet further, it is preferable that the mask tension control members have their respective clamps which fix the vapor deposition mask in a state in which the vapor deposition mask is under tension.

According to the above arrangement, clamps are provided to the respective mask tension control members. This makes it possible to securely fix the vapor deposition mask in a state in which the vapor deposition mask is under tension. It is therefore possible to carry out stronger and finer tension control. Consequently, it is possible to form a film with a higher accuracy.

Further, according to the above arrangement, the vapor deposition mask can be securely held by the clamps even when the vapor deposition mask has been subjected to some kind of treatment, for example, such as increase in mask surface smoothness of the vapor deposition mask, using a low-friction material as the mask base material, or subjecting the mask base material to low-friction coating, in order that the vapor deposition mask can be smoothly wound off and wound up by the wind-off roll and the wind-up roll.

In addition, it is possible to apply a stronger tension to the vapor deposition mask. This makes it possible to use a thicker mask base material or the like.

This makes it possible to extend the range of choices of the vapor deposition mask.

The film having the predetermined pattern can be an organic layer of an organic electroluminescent element. The vapor deposition device can be suitably used as a device for producing an organic electroluminescent element. That is, the vapor deposition device may be a device for producing an organic electroluminescent element.

Further, the vapor deposition method in accordance with the foregoing embodiments is a vapor deposition method for forming a film having a predetermined pattern on a film formation substrate with use of the above-described vapor deposition device, the vapor deposition method including the steps of: (i) moving at least a first one of a mask unit and a substrate holding member relative to a second one in a state in which rotations of a wind-off roll and a wind-up roll are stopped, so as to carry out vapor deposition; and (ii) carrying out mask updating by, when the mask unit meets a predetermined criterion for updating, rotating the wind-off roll and the wind-up roll to expose a region of a vapor deposition mask which region has an unused one-period pattern.

According to the above-described method, it is therefore possible to provide a vapor deposition method which achieves a high patterning accuracy and yields a high throughput.

It is preferable that the step (ii) is carried out during a period in which no film is formed. This makes it possible to carry out mask updating without hindering a film formation operation.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The vapor deposition device and vapor deposition method of the present invention are suitably applicable to, for example, a device and method for producing an organic EL display device which are used in a process of, for example, selective application formation of an organic layer in an organic EL display device.

REFERENCE SIGNS LIST

1 Organic EL display device
2 Pixel
2R, 2G, 2B Sub-pixel
10 TFT substrate
11 Insulating substrate
12 TFT
13 Interlayer film
13a Contact hole
14 Wire
15 Edge cover
15R, 15G, 15B Opening
20 Organic EL element
21 First electrode
22 Hole injection layer/hole transfer layer
23R, 23G, 23B Luminescent layer
24 Electron transfer layer
25 Electron injection layer
26 Second electrode
30 Adhesive layer
40 Sealing substrate
50 Vapor deposition device
51 Vacuum chamber
52 Substrate holder (substrate holding member)
52a Motor
53 Substrate moving mechanism
53a Motor
54 Mask unit
55 Mask unit moving mechanism
55a Motor
56 Alignment sensor
57 Void sensor
58 Absolute alignment reference marker
60 Mask (vapor deposition mask)
60a Mask roll section
61 Opening
61a Short side
61b Long side
62 Alignment marker
63 Mask absolute-alignment marker
64 Alignment marker
65 Alignment marker
66 Opening
67 Depressed portion
70 Vapor deposition source
71 Injection holes
80 Mask-to-substrate distance adjusting member
81 Up-and-down mechanism
82 Mask holding member
82 Rotating mechanism
91 Wind-off roll
92 Wind-up roll
93 Motor
94 Motor
95 Detector
96 Shutter
100 Control circuit
101 Mask position detecting section
102 Computing section
103 Wind-off roll drive control section
104 Wind-up roll drive control section
111 Image detecting section
112 Computing section
113 Substrate drive control section
114 Vapor deposition on/off control section
115 Shutter drive control section
116 Mask unit drive control section
121 Void difference amount computing section
122 Void difference correction amount deriving section
123 Up-and-down mechanism drive control section
200 Film formation substrate
201 Panel region
202 Alignment marker section 202a Alignment marker
203 Partition walls
211 Vapor-deposited film
212 Vapor-deposited object

The invention claimed is:

1. A vapor deposition device for forming a film having a predetermined pattern on a film formation substrate on which the film is to be formed, by depositing vapor deposition particles onto the film formation substrate through an opening of a vapor deposition mask, the vapor deposition device comprising:
a substrate holding member holding the film formation substrate;
a mask unit for forming the film having the predetermined pattern on the film formation substrate; and
moving means for moving at least a first one of the mask unit and the substrate holding member relative to a second one so as to carry out scanning,
the mask unit comprising:
(i) a vapor deposition source operative to inject vapor deposition particles;
(ii) a vapor deposition mask being constituted by a flexible mask base material having patterns periodically formed along a long-side direction of the mask base material, the patterns being identical in form to each other and each including the opening, wherein the vapor deposition mask is fixed in position relative to the vapor deposition source so that a direction perpendicular to a direction of scanning of the film formation substrate is the long-side direction of the mask base material, and a length of the mask base material along a direction perpendicular to the long-side direction of the mask base material is shorter than a length of the film formation substrate along the direction of scanning of the film formation substrate;
(iii) a wind-off roll, provided at one of opposite ends of the vapor deposition mask which ends are positioned along the long-side direction of the vapor deposition mask, operative to wind the vapor deposition mask therearound;
(iv) a wind-up roll, provided at the other end of the vapor deposition mask, operative to wind up the vapor deposition mask; and
(v) at least a pair of mask-to-substrate distance adjusting members,
the at least a pair of mask-to-substrate distance adjusting members operative to adjust a distance between the film formation substrate and a portion of the vapor deposition mask which portion lies between the at least a pair of mask-to-substrate distance adjusting members, in such a manner that at least one of the at least pair of mask-to-substrate distance adjusting members moves the vapor deposition mask in a direction perpendicular to a substrate surface of the film formation substrate,
the vapor deposition mask being provided so that a region having a one-period pattern of a plurality of period patterns of the mask base material is so exposed as to be held in parallel to the film formation substrate by the mask-to-substrate distance adjusting members, that other region having the other period patterns is wound around the wind-off roll and the wind-up roll, and that the exposed region of the vapor deposition mask is allowed to move in the direction perpendicular to the scanning direction by rotation of the wind-off roll and the wind-up roll.

2. The vapor deposition device according to claim 1, wherein
the wind-off roll and the wind-up roll are rotatably provided.

3. The vapor deposition device according to claim 1, wherein
the wind-off roll and the wind-up roll are provided at positions respectively opposite to the vapor deposition source with respect to the mask-to-substrate distance adjusting members, and
the mask-to-substrate distance adjusting members are provided on a side of the vapor deposition mask which side is opposite to a side thereof facing the vapor deposition source.

4. The vapor deposition device according to claim 1, wherein
the mask-to-substrate distance adjusting members include their respective rotation mechanisms which rotate in contact with the vapor deposition mask.

5. The vapor deposition device according to claim 1, wherein
the mask unit further comprises at least a pair of mask tension control members which adjust tension of the vapor deposition mask by contacting a first portion of the vapor deposition mask which portion lies between the wind-off roll and a first one of the mask-to-substrate distance adjusting members and contacting a second portion of the vapor deposition mask which portion lies between the wind-up roll and a second one of the mask-to-substrate distance adjusting members.

6. The vapor deposition device according to claim 5, wherein
the mask tension control members have their respective clamps which fix the vapor deposition mask in a state in which the vapor deposition mask is under tension.

7. The vapor deposition device according to claim 1, wherein
the film having the predetermined pattern is an organic layer of organic electroluminescent element.

8. A vapor deposition method for forming a film having a predetermined pattern on a film formation substrate with use of a vapor deposition device according to claim 1,
the vapor deposition method comprising the steps of:
(i) moving at least a first one of a mask unit and a substrate holding member relative to a second one in a state in which rotations of a wind-off roll and a wind-up roll are stopped, so as to carry out vapor deposition; and
(ii) carrying out mask updating by, when the mask unit meets a predetermined criterion for updating, rotating the wind-off roll and the wind-up roll to expose a region of a vapor deposition mask which region has an unused one-period pattern.

9. The vapor deposition method according to claim 8, wherein
the step (ii) is carried out during a period in which no film is formed.

* * * * *